US008287957B2

(12) United States Patent
Nealey et al.

(10) Patent No.: US 8,287,957 B2
(45) Date of Patent: Oct. 16, 2012

(54) METHODS AND COMPOSITIONS FOR FORMING APERIODIC PATTERNED COPOLYMER FILMS

(75) Inventors: Paul F. Nealey, Madison, WI (US); SangOuk Kim, Daejeon (KR); Erik W. Edwards, Council Bluffs, IA (US); Mark P. Stoykovich, Dover, NH (US); Juan J. de Pablo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1361 days.

(21) Appl. No.: 11/286,260

(22) Filed: Nov. 22, 2005

(65) Prior Publication Data

US 2006/0134556 A1 Jun. 22, 2006

Related U.S. Application Data

(60) Provisional application No. 60/630,484, filed on Nov. 22, 2004.

(51) Int. Cl.
*B05D 5/00* (2006.01)

(52) U.S. Cl. ......... 427/256; 427/551; 427/553; 427/258

(58) Field of Classification Search .................. 427/256, 427/551, 552, 553, 555, 258
See application file for complete search history.

(56) References Cited

U.S. PATENT DOCUMENTS

| | | | | |
|---|---|---|---|---|
| 3,444,732 | A | 5/1969 | McKinley et al. | |
| 4,235,657 | A | 11/1980 | Greenman et al. | |
| 5,948,470 | A | 9/1999 | Harrison et al. | |
| 6,746,825 | B2 * | 6/2004 | Nealey et al. | 430/315 |
| 6,893,705 | B2 | 5/2005 | Thomas | |
| 6,926,953 | B2 | 8/2005 | Nealey et al. | |
| 7,704,432 | B2 | 4/2010 | Dumond et al. | |
| 7,901,607 | B2 | 3/2011 | Xu et al. | |
| 7,959,975 | B2 | 6/2011 | Millward | |
| 2003/0091752 | A1 | 5/2003 | Nealey et al. | |
| 2003/0091865 | A1 | 5/2003 | Chen et al. | |
| 2004/0143063 | A1 | 7/2004 | Chen et al. | |
| 2007/0092721 | A1 | 4/2007 | Kishimoto | |

(Continued)

FOREIGN PATENT DOCUMENTS

JP 10-330494 12/1998

(Continued)

OTHER PUBLICATIONS

Fasolka, M.J., et al., "Block copolymer thin films: Physics and applications," Annual Review of Materials Research, 2001, 31, pp. 323-355.*

(Continued)

*Primary Examiner* — William Phillip Fletcher, III
(74) *Attorney, Agent, or Firm* — Weaver Austin Villeneuve & Sampson LLP

(57) ABSTRACT

The present invention provides improved and compositions methods for replicating substrate patterns including patterns containing irregular features. The methods of the invention involve depositing block copolymer materials on a patterned substrate and ordering components in the material to replicate the pattern. In some embodiments, ordering is facilitated through the use of blends of the copolymer material and/or configuring substrate patterns so that regions of the substrate pattern interact in a highly preferential manner with at least one of the components in the copolymer material. The invention also provides compositions containing a substrate pattern with irregular features replicated in a block copolymer material.

26 Claims, 33 Drawing Sheets

U.S. PATENT DOCUMENTS

| | | | |
|---|---|---|---|
| 2007/0095469 | A1 | 5/2007 | Burdinski |
| 2008/0257187 | A1 | 10/2008 | Millward |
| 2008/0299353 | A1 | 12/2008 | Stoykovich et al. |
| 2009/0087653 | A1 | 4/2009 | Nealey et al. |
| 2009/0087664 | A1 | 4/2009 | Nealey et al. |
| 2009/0196488 | A1 | 8/2009 | Nealey et al. |
| 2009/0260750 | A1 | 10/2009 | Nealey et al. |
| 2010/0255268 | A1 | 10/2010 | Choi et al. |

FOREIGN PATENT DOCUMENTS

| | | |
|---|---|---|
| JP | 2004-087531 | 3/2004 |
| JP | 2004-099667 | 4/2004 |
| JP | 2005-502916 | 1/2005 |
| JP | 2005-502917 | 1/2005 |
| JP | 2007125699 | 5/2007 |
| JP | 2007/138052 | 6/2007 |
| JP | 2007/313568 | 12/2007 |
| JP | 2011-080379 | 4/2011 |
| WO | 2003/023517 | 3/2003 |
| WO | WO2006112887 | 6/2006 |
| WO | 2007/111215 A | 10/2007 |
| WO | 2009/146086 | 3/2010 |

OTHER PUBLICATIONS

International Search Report dated May 2, 2007 from related International Application No. PCT/US05/42568.
Bates et al. (1990) Block Copolymer Thermodynamics: Theory and Experiment, Annu.Rev.Phys. Chem., 1990, 41: pp. 525-557.
Bates et al. (1997) Polymeric Bicontinuous Microemulsions, *Phy Rev Ltrs*, vol. 69, No. 5, Aug. 4, 1997.
Bates et al. (1995) Isotropic Lifshitz Behavior in Block Copolymer-Homopolymer Blends, *Phy Rev Ltrs*, vol. 75, No. 24, Dec. 11, 1995.
Broseta et al. (1990) Phase equilibria in copolymer/homopolymer ternary blends: Molecular weight effects, J. Chem. Phy., 93(4), Aug. 15, 1990.
Campbell et al. (2000) Fabrication of photonic crystals for the visible spectrum by holographic lithography, Nature, vol. 404, Mar. 2, 2000, p. 53.
Cheng et al.(2001) Formation of a Cobalt Magnetic Dot array via Block Copolymer Lithography, Advanced Materials, 2001, vol. 13, No. 15, Aug. 3, pp. 1174-1178.
Corvazier et al. (2001) Lamellar phases and microemulsions in model ternary blends containing amphiphilic block copolymers, The Royal Society of Chemistry, J. Mater. Chem, 2001, 11, pp. 2864-2874.
Düchs et al. (2003) Fluctuation Effects in Ternary AB+A+B Polymeric Emulsions, Macromolecules V36, pp. 9237-9248.
Düchs et al. (2004) Formation and structure of the microemulsion phase in two-dimensional ternary AB+A+B Polymeric emulsions, Jnl of Chem Phy, vol. 121, No. 6, Aug. 8, 2004, p. 2798.
Floudas et al. (1997) Microphase separation in block copolymer/homopolymer blends: Theory and experiment, J. Chem. Phys. 106 (8), Fe. 22, 1997, p. 3318.
Hillmyer et al. (1991) Model Bicontinuous Microemulsions in Ternary Homopolymer/Block Copolymer Blends, J. Phy. Chem. B 1999, 103, pp. 4814-4824.
Jeong et al. (2002) Asymmetric Block Copolymers with Homopolymers: Routes to Multiple Length Scale nanostructures, Adv. Mater 2002.,14, No. 4, Feb. 19, 2002, p. 274.
Jeong et al. (2003) Precise Control of Nanopore Size in Thin Film Using Mixtures of Asymmetric Block Copolymer and Homopolymer, Macromolecules 2003, 36, pp. 10126-10129.
Kim et al. (2003) Epitaxial self-assembly of block copolymers on lithographically defined nanopatterned substrates, Nature,vol. 424, Jul. 24, 2003, Nature Publishing Group, p. 411.
Krishnan et al. (2001) Shear-Induced Nano-Macro Structural Transition in a Polymeric Bicontinuous Microemulsion, Phy Rev Ltrs, vol. 87, No. 9, Aug. 27, 2001, p. 098301-1.
Mansky et al. (1997) Ordered Diblock Copolymer Films on Random Copolymer Brushes, Macromolecules 1997, 30, pp. 6810-6813.
Mansky et al. (2006) Controlling Polymer-Surface Interactions with Random Copolymer Brushes, http://www.jstor.org/, Wed. Aug. 16, 2006.
Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.
Morkved et al. (1999) Dynamics of ternary polymer blends: Disordered, ordered and bicontinouous microemulsion phases, Faraday Discuss.,1999, 112, pp. 335-350.
Morkved et al. (2001) Static and Dynamic Scattering from Ternary Polymer Blends: Bicontinuous Microemulsions, Lifshitz lines, and amphiphilicity, Jnl of Chem Phy, V.114, No. 16, Apr. 22, 2001, p. 7247.
Mortensen et al. (2000) Ternary mixture of homopolymer blend and diblock copolymer studied near the Lifshitz composition by small-angle neutron scattering, J. Appl. Cryst., 2000, 33, pp. 686-689.
Naito et al. (2002) 2.5-Inch Disk Patterned Media Prepared by an Artificially Assisted Self-Assembling Method, IEEE Trans.on Magnetics, vol. 38, No. 5, Sep. 2002, p. 1949.
Orso et al. (1999) Phase Behavior of Thin Film Blends of Block Copolymers and Homopolymers: Changes in Domain Dimensions, Macromolecules, 32, pp. 1087-1092.
Rockford et al. (1999) Polymers on Nanoperiodic, Heterogeneous Surfaces, Phy. Rev. Ltrs, The American Physical Society, vol. 82, No. 12, p. 2602.
Schattenburg et al. (1995) Optically matched trilevel resist process for nanostructure fabrication, J. Vac. Sci Technol. B, 15(6), Nov./Dec. 1995, p. 3007.
Schwahn et al. (1999) Crossover from 3D Ising to Isotropic Lifshitz Critical Behavior in a Mixture of a Homopolymer Blend and Diblock Copolymer, Phy. Rev. Ltrs, The American Physical Society, vol. 82, No. 25, Jun. 21, 1999, p. 5056.
Schwahn et al. (2000) Thermal Composition fluctuations near the isotropic Lifshitz critical point in a ternary mixture of a homopolymer blend and diblock copolymer, Jnl. Chem. Phy., vol. 112 , No. 12, Mar. 22, 2000, p. 5454.
Solak, Harun H. (2006) Nanolithography with coherent extreme ultraviolet light, Jnl. of Physics D: App. Phys,39 (2006) R171-R188.
Stoykovich et al. (2005) Directed Assembly of Block Copolymer Blends into Nonregular Device-Oriented Structures, Science, vol. 308, Jun. 3, 2005, www.sciencemag.org, p. 1442.
Stoykovich et al. (2006) Block Copolymers and Conventional Lithography, Materialstoday, vol. 9, No. 9, Sep. 2006, p. 20.
Teubner et al. (1987) Origin of the Scattering Peak in Microemulsions, J. Chem. Phys., 87(5), Sep. 1, 1997, p. 3195.
Torikai et al. (1997) Lamellar Domain Spacings of Diblock Copolymer/Homopolymer Blends and Conformations of Block Chains in Their Microdomains, Macromolecules, 30, pp. 5698-5703.
Whitesides et al. (2002) Self-Assembly at All Scales, Science, AAAS, 295, p. 2418.
Yang et al. (2000) Guided Self-Assembly of Symmetric Diblock Copolymer Films on Chemically Nanopatterned Substrates, Macromolecules 2000, 33, pp. 9575-9582.
U.S. Appl. No. 11/645,060, filed Oct. 5, 2006, Nealey et al.
U.S. Appl. No. 11/580,694, filed Oct. 12, 2006, Nealey et al.
U.S. Appl. No. 11/879,758, filed Feb. 17, 2007, Nealey et al.
Written Opinion dated May 2, 2007 issued in WO2006112887.
Preliminary Examination Report dated May 30, 2007 issued in WO2006112887.
Berreman et al. (1990) Use of trilevel resists for high-resolution soft-x-ray projection lithography, *Appl. Phys Lett.* 56 (22), May 28, 1990, p. 2180.
Black et al. (2004) High-Capacity, Self-Assembled Metal-Oxide-Semiconductor Decoupling Capacitors, *IEEE Electron Device Ltrs*, vol. 25, No. 9, Sep. 2004.
Boltau et al. (1998) Surface-induced structure formation of polymer blends on patterned substrates, *Nature*, vol. 391, Feb. 1998, p. 877.
Burgaz et al. (2000) T-Junction Grain Boundaries in Block Copolymer-Homopolymer Blends, *Macromolecules*, vol. 33, pp. 8739-8745.

Cardinale et al. (1999) Demonstration of pattern transfer into sub-100 nm polysilicon line/space features patterned with extreme ultraviolet lithography, *J. Va. Sci. Technol.B* vol. 17(6), Nov./Dec. 1999.
Chan et al. (1999) Ordered Bicontinuous Nanoporous and Nanorelief Cermamic Films from Self Assembling Polymer Precursors, *Science*, 286, 1716 (1999); DOI: 10.1126/science.386.5445.1716.
Chen et al. (1998) Morphology of thin block copolymer films on chemically patterned substrates, Journal of Chemical Physics, Apr. 22, 1998, vol. 108, No. 16, p. 6897.
Cheng et al. (2002) Fabrication of nanostructures with long-range order using block copolymer lithography, *App Phy Ltrs*, vol. 81, No. 19, Nov. 4, 2002, p. 3657.
Coulon et al. (1989) Surface-Induced Orientation of Symmetric, Diblock Copolymers: A Secondary Ion Mass Spectrometry Study, *Macromolecules*, vol. 22, pp. 2581-2589.
Coulon et al. (1993) Time Evolution of the Free Surface of Ultrathin Copolymer Films, Macromolecules, vol. 26, pp. 1582-1589.
Daoulas et al. (2006) Fabrication of Complex Three-Dimensional Nanostructures from Self-Assembling Block Copolymer Materials on Two-Dimensional Chemically Patterned Templates with Mismatched Symmetry, *Physical Review Letters*, Jan. 27, 2006, PRL 96, 036104.
Daoulas et al. (2006) Morphology of multi-component polymer systems: single chain in mean field simulation studies, *The Royal Society of Chemistry, Soft Matter*, 2006, vol. 2, pp. 573-583.
Fasolka et al. (2000) Morphology of Ultrathin Supported Diblock Copolymer Films: Theory and Experiment, *Macromolecules* vol. 33, pp. 5702-5712.
Fukukawa et al. (2005) Synthesis and Characterization of Silicon-Containing Block Copolymers from Nitroside-Mediated Living Free Radical Polymerization, Macromolecules vol. 38, pp. 263-270.
Helfand et al. (1972) Theory of the Interface between Immiscible Polymers, II, Journal of Chemical Physics, vol. 56, No. 7, Apr. 1, 1972.
Huang et al. (1991) Modeling Copolymer Adsorption on Laterally Heterogeneous Surfaces, Physical Review Letters, Feb. 4, 1991, vol. 66, No. 5, p. 620.
Muller et al. (2004) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).
Park et al. (2003) Enabling nanotechnology with self assembled block copolymer patterns, *Polymer*, vol. 44 (2003) pp. 6725-6760; www.sciencedirect.com.
Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.
Russell et al. (1989) Characteristics of the Surface-Induced Orientation for Symmetric Diblock PS/PMMA Copolymers, *Macromolecules*, vol. 22, pp. 4600-4606.
Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).
Urbas et al. (2000) Tunable Block Copolymer/Homopolymer Photonic Crystals, *Advanced Materials*, vol. 12, No. 11 p. 812.
Urbas et al. (2002) Bicontinuous Cubic Block Copolymer Photonic Crystals, *Advanced Materials*, vol. 14, No. 24, Dec. 17, 2002, p. 1850.
Whitesides et al. (1991) Molecular self-Assembly and Nanochemistry: A Chemical Strategy for the Synthesis of Nanostructures, *Articles, Science* vol. 254, p. 1312, Nov. 29, 1991.
Xu et al. (2001) The Influence of molecular weight on nanoporous polymer films, *Polymer*, 42 (2001) pp. 9091-9095; www.elsevier.com/locate/polymer.
Wang et al., "Symmetric diblock copolymer thin films confined between homogeneous and patterned surfaces: Simulations and theory", Journal of Chemical Physics, vol. 112, No. 22, Jun. 8, 2000, pp. 9996-10010.
Kim, et al., "Chemical Modification of Self-Assembled Monolayers by Exposure to Soft X-rays in Air", J. Phys. Chem. B, vol. 104, No. 31, 2000, pp. 7403-7410.
Peters, et al., "Using Self-Assembled Monolayers Exposed to X-rays to Control the Wetting Behavior of Thin Films of Diblock Copolymers", vol. 16, No. 10, 2000, pp. 4625-4631.
Thurn-Albrecht, et al., "Nanoscopic Templates from Oriented Block Copolymer Films," Communications, Advanced Materiels, 2000, 12, No. 11, pp. 787-791.
Cheng, et al., "Formation of a Cobalt Magnetic Dot array via Block Copolymer Lithography," Advanced Materials 2001, 13, No. 15, Aug. 3, pp. 1174-1178.
Cheng et al., "Templated Self-Assembly of Block Copolymers: Effect of Substrate Topography," Advanced Materials 2003, 15, No. 19, Oct. 2, pp. 1599-1602.
Edwards et al., "Precise Control over Molecular Dimensions of Block-Copolymer Domains Using the Interfacial Energy of Chemically Nanopatterned Substrates," Advanced Materials 2004, 16, No. 15, Aug. 4, pp. 1315-1319.
Li et al., "Dense arrays of ordered GaAs nanostructures by selective area growth on substrates patterned by block copolymer lithography," Applied Physics Letters, vol. 76, No. 13, Mar. 27, 2000, pp. 1689-1691.
Black et al., "Integration of self-assembled diblock copolymers for semiconductor capacitor fabrication," Applied Physics Letters, vol. 79, No. 3, Jul. 16, 2001, pp. 409-411.
Asakawa et al., "Nanopatterning with Microdomains of Block Copolymers using Reactive-Ion Etching Selectivity," Jpn. J. Appl. Phys. vol. 41 (2002) pp. 6112-6118.
Park et al., "Block Copolymer Lithography: Periodic Arrays of ~ $10^{11}$ Holes in 1 Square Centimeter," Science, vol. 276, May 30, 1997, pp. 1401-1404.
Thurn-Albrecht et al., "Ultrahigh-Density Nanowire Arrays Grown in Self-Assembled Diblock Copolymer Templates," Science, Dec. 15, 2000, vol. 290, pp. 2126-2129.
Nealey, Paul Franklin, et al., "Density Multiplication and Improved Lithography by Directed Block Copolymer Assembly," U.S. Appl. No. 12/329,484, filed Dec. 5, 2008.
International Search Report and Written Opinion of the International Searching Authority mailed Aug. 24, 2009, Application No. PCT/US 2008/085742, 14 pages.
Park, C., et al., "Enabling Nanotechnology with Self Assembled Block Copolymer Patterns," *Polymer*, Elsevier Science, Publishers B.V., GB, vol. 44, No. 22, Oct. 1, 2003, pp. 6725-6760.
Black, C.T., et al, "Polymer Self Assembly in Semiconductor Microelectronics," IBM Journal of Research and Development, International Business Machines Corporation, New York, vol. 51, No. 5, Sep. 1, 2007, XP007905680, pp. 605-633.
Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.
Stoykovich, M.P., et al, "Block Copolymers and Conventional Lithography," *Materials today*, Elsevier Science, Kidlington, GB, vol. 9, No. 9, Sep. 1, 2006, pp. 20-29.
Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.
Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.
U.S. Office Action mailed Apr. 3, 2009, from U.S. Appl. No. 11/545,060.
Nealey, Paul Franklin, "Directed Assembly of Triblock Copolymers," U.S. Appl. No. 11/580,694, filed Oct. 12, 2006.
Stoykovich, Mark P., et al., "Methods and Compositions for Forming Patterns With Isolated or Discrete Features Using Block Copolymer Materials," U.S. Appl. No. 11/879,758, filed Jul. 17, 2007.
U.S. Office Action mailed Jul. 23, 2009, from U.S. Appl. No. 11/545,060.

Bates, et al., "Block Copolymers—Designer Soft Materials," *Physics Today*, Feb. 1999, 7 pages.
Bohbot-Raviv, et al., "Discovering New Ordered Phases of Block Copolymers," The American Physical Society, vol. 85, No. 16, Oct. 16, 2000, 4 pages.
Craig, et al., "Self Assembly of Block Copolymers on Lithographically Defined Nano Patterned Substrate," Journal of Photopolymer Science & Technology, vol. 20, No. 4, Jun. 4, 2007, 7 pages.
Daoulas, et al., "Directed Assembly of Copolymer Materials on Patterned Substrates: Balance of Simple Symmetries in Complex Structures," Journal of Polymer Science, Copyright 2006, vol. 44, pp. 2589-2604.
Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.
Detcheverry, et al., Monte Carlo Simulation of Coarse Grain Polymeric Systems, *The American Physical Society*, May 15, 2009, PRL 102(19) 197801(4), pp. 197801-1-197801-4.
Detcheverry, et al., Monte Carlo Simulations of a Course Grain Model for Block Copolymers and Nanocomposites, published Jun. 11, 2008, vol. 41, pp. 4989-5001.
Edwards, et al., "Long-Range Order and Orientation of Cylinder-Forming Block Copolymers on Chemically Nanopatterned Striped Surfaces," American Chemical Society, Macromolecules, published Apr. 13, 2006, vol. 39, pp. 3598-3607.
Edwards, et al., "Mechanism and Kinetics of Ordering in Diblock Copolyer Thin Films on Chemically Nanopatterned Substrates," Journal of Polymer Science: Part B, Polymer Physics, 2005, vol. 43, pp. 3444-3459.
Ekinci, et al., "20 nm Line/Space Patterns in HSQ Fabricated by EUV Interference Lithography," Photon Lithography, MNE 2006 Micro- and Nano-Engineering, 2 pages.
Galatsis, K., et al., Patterning and Templating for Nanoelectronics., *Advanced Materials*, 2010, vol. 22, pp. 769-778.
Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.
Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.
Hirai, et al., "One-Step Direct-Patterning Template Utilizing Self-Assembly of POSS-Containing Block Copolymers," *Adv. Mater*., 2009, vol. 21, pp. 4334-4338.
Hong, A., et al., "Metal Nanodot Memory by Self-Assembled Block Copolymer Lift-Off," *American Chemical Society*, Nano Left 2010, vol. 10, pp. 224-229.
In, et al., Side-Chain-Grafted Random Copolymer Brushes as Neutral Surfaces for Controlling the Orientation of Block Copolymer Microdomains in Thin Films, American Chemical Society, Langmuir, published Aug. 1, 2006, vol. 22, pp. 7855-7860.
Ji, et al., "Generalization of the Use of Random Copolymers to Control the Wetting Behavior of Block Copolymer Films," American Chemical Society, published Nov. 11, 2008, vol. 41, pp. 9098-9103.
Ji, et al., "Preparation of Neutral Wetting Brushes for Block Copolymer Films from Homopolymer Blends," Advanced Materials, 2008 vol. 20, pp. 3054-3060.
Ji, Shengxiang, et al., "Molecular Transfer Printing Using Block Copolymers," *ACSNano* vol. 4, No. 2, 2010, pp. 599-609.
Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.
Kang, et al., "Hierarchical Assembly of Nanoparticle Superstructures from Block Copolymer-Nanoparticle Composites," published Apr. 9, 2008, vol. 100(4), pp. 148303-1-148303-4.
Kim, et al., "Defect Structure in Thin Films of a Lamellar Block Copolymer Self-Assemble on Neutral Homogeneous and Chemically Nanopatterned Surfaces," *American Chemical Society*, Macromolecules, published Jul. 13, 2006, vol. 39, 5466-5470.
Kim, et al., "Synthesis of Photacid Generator-Containing Patternable Diblock Copolymers by Reversible Addition—Fragmentation Transfer Polmerization," Chemistry of Materials, *American Chemical Society*, Jul. 6, 2009, pp. 3030-3032.
La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.
Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.
Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.
Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.
Park, et al., "Characterization of Cylinder-Forming Block Copolymers Directed to Assemble on Spotted Chemical Patterns," *American Chemical Society*, Macromolecules, Published Nov. 4, 2008, vol. 41, pp. 9118-9123.
Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.
Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.
Park, et al., "Selective Growth and Characterization of InGaAs Quantum Dots on Patterned InP Substrates Utilizing a Diblock Copolymer Template," *IEEE* 978-4244-3433-6/09, copyright 2009, pp. 52-54.
Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.
Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.
Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.
Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.
Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.
Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.
Solak, et al., "Sub-50 nm Period Patterns With EUV interference Lithography," *Microelectronic Engineering* 67-68 (2003) 56-62.
Pike, et al., "Theoretically Informed Coarse Grain Simulations of Polymeric Systems," *The Journal of Chemical Physics*, Published Aug. 27, 2009, vol. 131, pp. 084903-1to 084903-10.
Ruiz, et al., "Density Multiplication and Improved Lithography by Directed block Copolymer Assembly," *Science*, vol. 321, Aug. 15, 2008, pp. 936-939.
Son, et al., "Placement Control of Nanomaterial Arrays on the Surface-Reconstructed Block Copolymer Thin Films," *ACSNano*, vol. 3, No. 12, 2009, pp. 3927-3934.
Son, et al., "Surfactant-Assisted Orientation of Thin Diblock Copolyer films," *Advanced Materials*, 2008, vol. 20, pp. 3643-3648.
Stoykovich, M.P., et al, "Remediation of Line Edge Roughness in Chemical Nanopatterns by the Directed Assembly of Overlying Block Copolymer Films," Macromolecules, *American Chemical Society*, vol. 43, Feb. 10, 2010, pp. 2334-2342.
Stuen, et al., In situ Characterization of Block Copolymer Ordering on Chemically Nanopatterned Surfaces by time-resolved small angle X-ray Scattering, *J. Vac. Sci. Technol*. vol. 26(6), published Dec. 1, 2008, pp. 2504-2508.
Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.
Suh, Hyo Seon, et al., "Orientation of Block Copolymer Resists on Interlayer Dielectrics with Tunable Surface Energy," American Chemical Society, vol. 43, Nov. 13, 2009, pp. 461-466.
Ting, et al., "Plasma Etch Removal of Poly (methyl methacrylate) in Block Copolymer Lithography," J. Vac. Sci. Technol., vol. 26(5), Sep./Oct. 2008, pp. 1684-1689.
Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.
Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.
Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.
Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.
Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.
Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.
Welander, et al., "Rapid Directed Assembly of Block Copolymer Films at Elevated Temperatures," *American Chemical Society*, Macromolecules, vol. 41, Published Apr. 1, 2008, pp. 2759-2761.
Xiao, et al., "Graphoepitaxy of Cylinder-forming Block Copolymers for Use as Templates to Pattern Magnetic Metal Dot Arrays," Institute of Physics Publishing, Nanotechnology, vol. 16, 2005, pp. S324-S329.
Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.
Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.
Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.
Nealey, Paul Franklin, et al., "Molecular Transfer Printing Using Block Copolymers," U.S. Appl. No. 12/416,816, filed Apr. 1, 2009.
International Search Report and Written Opinion of the International Searching Authority mailed Dec. 16, 2009, Application No. PCT/US2009/039208.
U.S. Office Action mailed Nov. 30, 2009, from U.S. Appl. No. 11/545,060.
U.S. Office Action mailed Dec. 2, 2009, from U.S. Appl. No. 11/580,694.
U.S. Final Office Action mailed Mar. 8, 2010, from U.S. Appl. No. 11/545,060.
Detcheverry, et al., "Theoretically Informed Coarse Grain Simulations of Block Copolymer Melts: Method and Applications," *Soft Matter*, 5 (24), 2008, 4868-4865.
Detcheverry, et al., "Simulations of Theoretically Informed Coarse Grain Simulations of Polymeric Systems," Foraday Discussions 144, (2010) 111-125.
Edwards, et al., Binary Blends of diblock Copolymers as an Effective route to Multiple, Length Scales in Perfect Directed Self-Assembly of Diblock Copolymer Thin Films, *J. Vac. Sci., Technol.*, vol. 24, No. 1, Jan./Feb. 2006, pp. 340-344.
Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.
Morin, et al., "Assembly of Nanocrystal Arrays by Block-Copolymer-Directed Nucleation," *Angew. Chem. Inc.*, Ed. 2009, vol. 48, pp. 2135-2139.
Nakano, et al., Single-Step Single-Molecure PCR of DNA with a Homo-Priming Sequence Using a Single Primer and Hot-Startable DNA Polymerase, *Journal of Bioscience and Bioengineering*, 2000, vol. 90 No. 4, pp. 456-458.
Park, et al., "Nano-Scale Selective Growth and Optical Characteristics of Quantum Dots on III-V Substrates Prepared by Diblock Copolymer Nano-Patterning," *Journal of Nanophotonics* 3 (1), 2009), 031604.
Wang, et al., Monte Carlo Simulations of Diblock Copolymer Thin Films Confined Between two Homogeneous Surfaces, Journal of Chemical Physics 2000, 112(1): 450-464.
U.S. Final Office Action mailed Jun. 10, 2010, from U.S. Appl. No. 11/580,694.
Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.
Morkved et al., "Local control of microdomain orientation in diblock copolymer thin films with electric fields," *Science*, 273 (5277): 931-933 Aug. 16, 1996.
Kim, SH, et al., "Highly oriented and ordered arrays from block copolymers via solvent evaporation," *Advanced Materials*, Feb. 3, 2004, 16 (3), pp. 226-231.
Fasolka, MJ, et al., Block copolymer thin films: Physics and applications, *Annual Review of Materials Research*, 2001, 31, pp. 323-355.
Tanaka, H, et al., "Ordered Structure in Mixtures of a Block Copolymer and Homopolymers . 1. Solubilization of Low-Molecular-Weight Homopolymers," *Macromolecules*, 24 (1), Jan. 7, 1991, pp. 240-251.
Hamley, et al., Nanostructure fabrication using block copolymers, *Nanotechnology*, Oct. 2003, 14 (10), pp. R39-R54.
Segalman, RA, et al., "Graphoepitaxy of spherical domain block copolymer films," *Advanced Materials*, Aug. 3, 2001, 13 (15) pp. 1152.
U.S. Office Action mailed Jul. 23, 2009, from U.S. Appl. No. 11/879,758.
U.S. Final Office Action mailed Mar. 8, 2010, from U.S. Appl. No. 11/879,758.
Office Action mailed Apr. 20, 2011 for U.S. Appl. No. 12/416,816.
Office Action mailed Apr. 21, 2011 for U.S. Appl. No. 12/329,484.
Watanabe, et al., "Smart Block Copolymer Masks With Molecule-Transport Channels for Total Wet Nanopatterning," *J. Mater. Chem*, 2008, vol. 18, 5482-5491.
Final Office action mailed Jul. 8, 2011, U.S. Appl. No. 11/879,758.
Final Office Action mailed Oct. 14, 2011 for U.S. Appl. No. 12/329,484.
Office Action mailed Aug. 31, 2011 for U.S. Appl. No. 12/416,816.
Final Office Action mailed Sep. 1, 2011, from U.S. Appl. No. 11/545,060.
Supplemental European Search Report mailed Oct. 26, 2011, from U.S. Application No. 05857837.8.
Notice of Allowance mailed Nov. 2, 2011 for U.S. Appl. No. 12/416,816.
Allowed Claims as of Nov. 2, 2011 for U.S. Appl. No. 12/416,816.
Notice of Allowance mailed Nov. 4, 2011 for U.S. Appl. No. 11/879,758.
Allowed Claims as of Nov. 4, 2011 for U.S. Appl. No. 11/879,758.
Notice of Allowance mailed Dec. 21, 2011, for U.S. Appl. No. 11/545,060.
Allowed Claims as of Dec. 21, 2011, for U.S. Appl. No. 11/545,060.

U.S. Office Action mailed Jul. 12, 2010, from U.S. Appl. No. 11/545,060.
Office Action mailed Oct. 7, 2010 for U.S. Appl. No. 12/416,816.
U.S. Office Action mailed Mar. 15, 2011, from U.S. Appl. No. 11/545,060.
U.S. Office Action mailed Dec. 17, 2010, from U.S. Appl. No. 11/545,060.
Nealey, P., et al., "Solvent Annealing Block CoPolymers on Patterned Substrates," filed Feb. 7, 2011, U.S. Appl. No. 61/440,354. (Relevance explained in attached IDS Transmittal).
Japanese Office Action received Jul. 3, 2012 for Application No. 2007-543480.

* cited by examiner

135° Angled Lamellae with $L_S$ = 70 nm

135 ° Angled Lamellae with $L_S$ = 65 nm

135° Angled Lamellae with $L_S$ = 70 nm

135 ° Angled Lamellae with $L_S$ = 75 nm

135° Angled Lamellae with $L_S$ = 80 nm

90° Angled Lamellae with $L_S$ = 65 nm

90° Angled Lamellae with $L_S$ = 70 nm

90° Angled Lamellae with $L_S$ = 75 nm

90° Angled Lamellae with $L_S$ = 80 nm

45° Angled Lamellae with $L_S = 65$ nm

45° Angled Lamellae with $L_S$ = 70 nm

45° Angled Lamellae with $L_S$ = 75 nm

45° Angled Lamellae with $L_S$ = 80 nm

METHODS AND COMPOSITIONS FOR FORMING APERIODIC PATTERNED COPOLYMER FILMS

CROSS-REFERENCE TO RELATED APPLICATION

This application claims priority under 35 USC §119(e) from U.S. Provisional Application No. 60/630,484, filed Nov. 22, 2004, hereby incorporated by reference in its entirety and for all purposes.

FIELD OF THE INVENTION

The invention relates to methods of nanofabrication techniques. More specifically, the invention relates to patterning materials at the nanoscale level utilizing block copolymers.

BACKGROUND OF THE INVENTION

As the development of nanoscale mechanical, electrical, chemical and biological devices and systems increases, new processes and materials are needed to fabricate nanoscale devices and components. This is especially true as the scale of these structures decreases into the tens of nanometers. There is a particular need for materials and methods that are able to duplicate nanoscale patterns over large areas with perfect or near-perfect registration of the pattern features. Block copolymer materials are useful in nanofabrication because they self-assemble into distinct domains with dimensions in the tens of nanometers or lower.

However, existing methods of using block copolymer material suffer from several limitations. Approaches that rely solely on copolymer self-assembly suffer from defects in the patterns. One approach to nanopatterning with block copolymers combines chemical patterning of a substrate by advanced lithographic techniques with the self-assembly of the block copolymers. The chemical pattern directs the self-assembly of the block copolymer, producing perfect or near-perfect duplication of the pattern and registration of the pattern features over a large area.

However, thus far the use of directed self-assembly of block copolymers to replicate patterns has been limited to the replication of periodic patterns. This precludes replicating patterns having irregular features, as would be required by many applications. In addition, the methods and materials used thus far have been limited in that a particular material can be used to replicate only a narrow range of substrate patterns.

What is needed therefore are methods and compositions for replicating patterns containing irregular features in block copolymer films. In addition, it would be desirable to have improved materials and methods providing greater process latitude in replicating periodic and aperiodic patterns.

SUMMARY OF THE INVENTION

The present invention meets these needs by providing improved methods of replicating substrate patterns including patterns containing irregular features. The methods of the invention involve depositing block copolymer materials on a patterned substrate and ordering components in the material to replicate the pattern. In some embodiments, ordering is facilitated through the use of blends of the copolymer material and/or configuring substrate patterns so that regions of the substrate pattern interact in a highly preferential manner with at least one of the components in the copolymer material. The invention also provides compositions containing a substrate pattern with irregular features replicated in a block copolymer material. Applications of the methods and compositions of the invention include forming masks for further processing steps, for example, in semiconductor processing, and forming functional features in the block copolymer material, for example, nanoscale conductive lines.

One aspect of the invention involves providing a patterned substrate, the pattern having at least one irregular feature, depositing a layer of material comprising a block copolymer on the substrate, and ordering components in the copolymer material in accordance with the underlying pattern to replicate the pattern in the copolymer layer. Another aspect of the invention is a composition comprising a patterned substrate, the pattern having at least one irregular feature, and a copolymer layer comprising a block copolymer, wherein the pattern is replicated in the copolymer layer.

In some embodiments, the substrate patterns that may be used with the present invention have at least one irregular feature. Irregular features include, though are not limited to, corners, angles, t-junctions and rings. In embodiments wherein the block copolymer material exhibits lamellar morphology, irregular features include all non-linear features, including corners, angles, t-junctions and rings. Similarly, in embodiments wherein the block copolymer material exhibits parallel cylindrical array morphology, irregular features include all non-linear features. Substrate patterns that may be used in accordance with the present invention may also be characterized as aperiodic patterns. In some embodiments, patterns used in accordance with the invention include aperiodic and periodic regions.

Ordering the components in the copolymer materials may be facilitated through the use of blends of the copolymer material. The copolymer material comprises a block copolymer. In some embodiments, the copolymer material comprises a first block copolymer and at least one of a second block copolymer, a first homopolymer and a second homopolymer. In a preferred embodiment, the block copolymer material comprises first and second homopolymers wherein the first homopolymer is same type of polymer as a first polymer block in the block copolymer and the second hompolymer is same type of polymer as a second polymer block in the block copolymer. In a particularly preferred embodiment, the copolymer material is a PS-b-PMMA/PS/PMMA blend. In another preferred embodiment, the volume fraction of homopolymer in the blend ranges from 0 to 0.8. In a particularly preferred embodiment, the volume fraction of the homopolymer in the blend ranges from 0.4 to 0.6. The copolymer material may contain a swellable material in addition to or instead of a homopolymer. Examples of swellable materials include a solvent, a plasticizer or a supercritical fluid.

Ordering of the copolymer material may also be facilitated by configuring substrate patterns so that regions of the substrate pattern interact in a highly preferential manner with at least one of the components in the copolymer material. For example, the interfacial energy contrast between the pattern and block A and the pattern and block B may be increased. In a preferred embodiment, the difference between the interfacial energy between a region of the pattern and a first block of the copolymer and the interfacial energy between the region and a second block of the copolymer is least 0.6 ergs/$cm^2$.

Ordering the copolymer material in accordance with the underlying pattern may involve stretching or compressing the components of the material.

Ordering the copolymer material in accordance with the underlying pattern may involve a non-uniform distribution of the material over the substrate.

Facilitating ordering by the methods described above may be used to improved replication of periodic patterns (or periodic regions of a pattern) as well as patterns or regions containing irregular features.

The substrate may be patterned by chemical patterning or by otherwise activating the surface of the substrate. In preferred embodiments, the substrate is patterned by x-ray lithography, extreme ultraviolet (EUV) lithography or electron beam lithography.

In some embodiments the patterned substrate comprises a patterned imaging layer. In preferred embodiments, the imaging layer comprises a polymer brush or a self-assembled monolayer. Examples of polymer brushes include homopolymers or copolymers of the monomers that make up the copolymer material. Examples of self-assembled monolayers include silanes and siloxane compounds.

The methods and compositions of the invention may be used in semiconductor processing. The copolymer material may be used as a resist mask and the methods of the invention may include selectively removing a component of the copolymer material after the material is ordered in accordance with the underlying pattern.

The methods and compositions of the invention may also be used to create functional copolymer features, such as a nanoscale conductive lines. For example, one of the components of the copolymer material may be an insulator and another one of the components of the copolymer material may be a conductor. The copolymer material may be inherently insulative or conductive or incorporate insulative or conductive materials, e.g., conductive nanoparticles.

DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
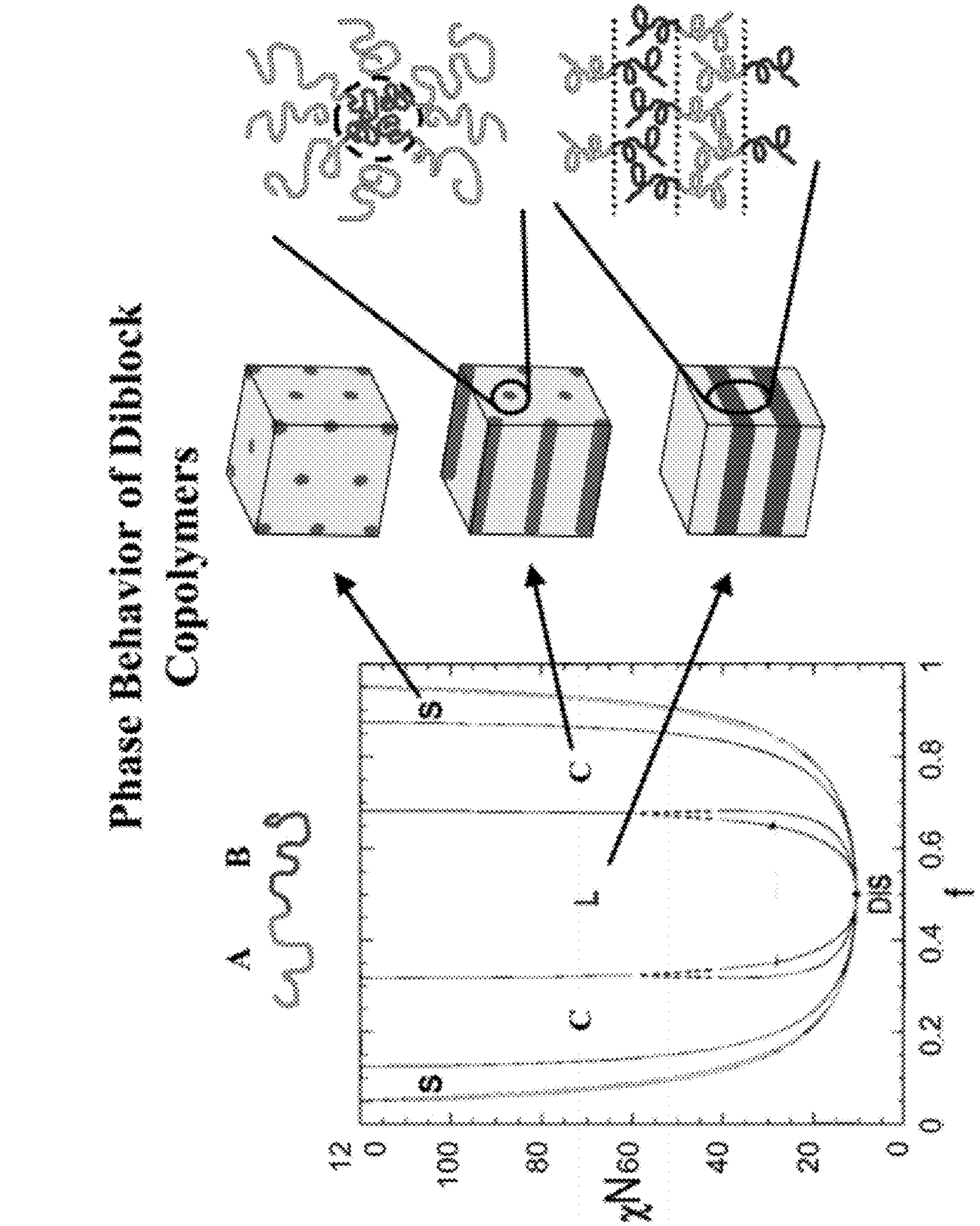
FIG. 1 shows ideal base behavior of diblock copolymers.

Block copolymers are a class of polymers synthesized from two or more polymeric blocks. The structure of diblock copolymer AB may correspond, for example, to AAAAAAA-BBBBBBBB. FIG. 1 shows ideal phase behavior of diblock coplymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 5-50 nm. The phase behavior of block copolymers containing more than two types of blocks (e.g. A-b-B-b-C), also results in microphase separation into different domains.

The size and shape of the domains depend on the molecular weight and composition of the copolymer.

Figure 2:
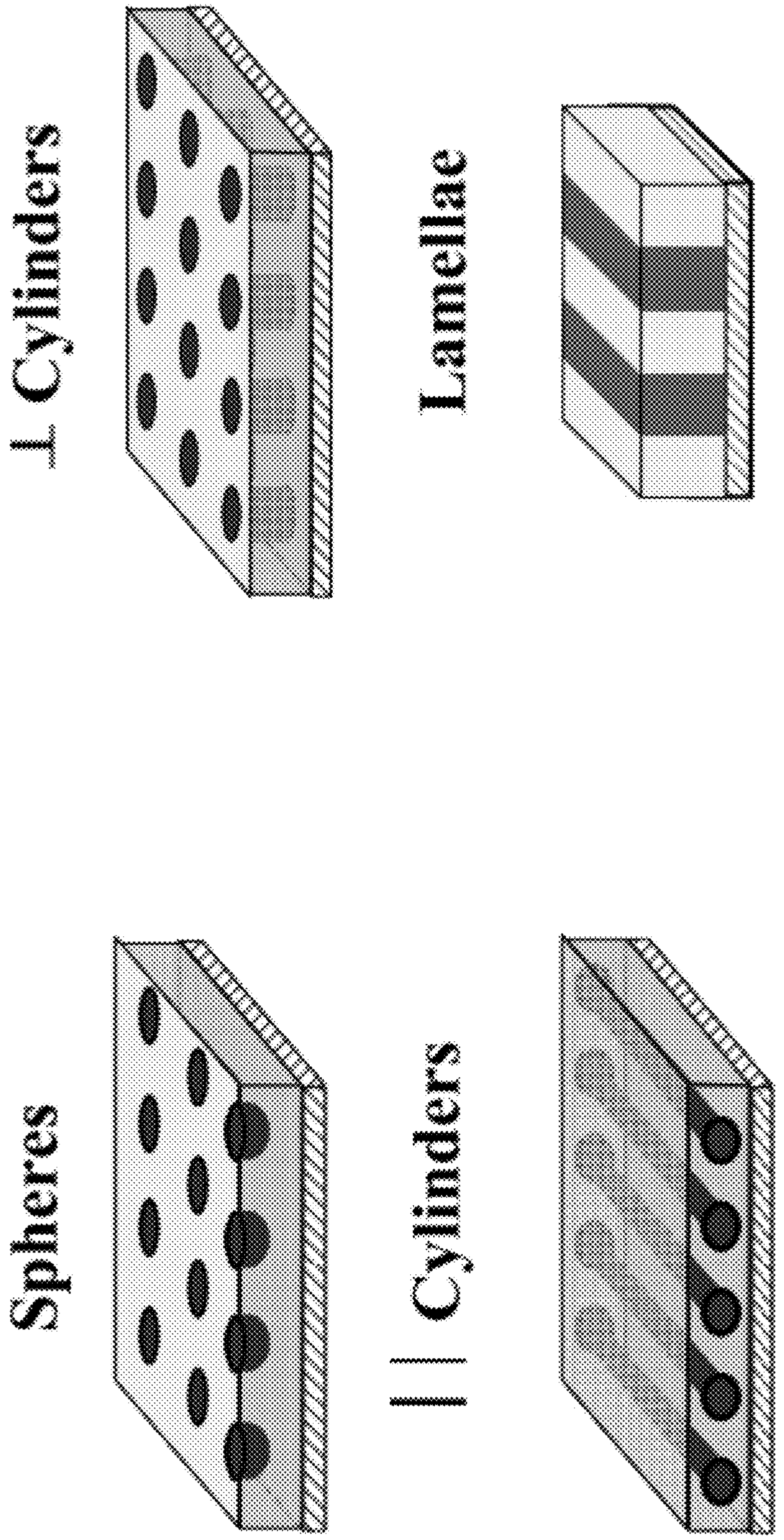
FIG. 2 shows spherical, cylindrical and lamellar ordered copolymer domains formed on substrates.

FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate.

Ordered domains as shown in FIG. 2 may be used as a templates for patterns. Park et al. (Science, 1997 276, 1401) describe diblock copolymer films deposited on silicon substrates. The diblock copolymer microphase separated into a periodic array of spheres. The block that formed the spheres was removed, leaving the remaining block with spherical holes, similar to that shown in FIG. 2. The remaining block was then used as a mask to etch a dense array of holes (approximately $10^{11}$ holes/$cm^2$) into the silicon substrate. Li et al. (Applied Physics Letters, 2000, 76, 1689) describe using block copolymers as a template to pattern a silicon nitride hard mask, which was then used to grow gallium arsenide nanostructures. Both of these uses of diblock copolymers require a breakthough etch step to transfer the pattern from the block to the substrate. Asakawa et al. (Jpn. J. Applied Physics, 2002, 41, 6112) describe etching a spherically ordered polystyrene-b-poly methyl methacylate (PS-b-PMMA) diblock copolymer film on a substrate with reactive ion etching (RIE). RIE preferentially etched the PMMA, resulting in a direct transfer of the pattern from the block copolymer film to the substrate. Applications for using block copolymer domains as templates for patterning include growing ultrahigh density nanowire arrays (see Thurn-Albrecht et al., Science, 2000, 290, 2126) and fabricating low-voltage scalable nanocrystal FLASH memory (Guarini et al., IBM Semiconductor Research and Development Center, 2004 IEEE IEDM Conference presentation). All of the above references are hereby incorporated by reference for all purposes.

The block copolymer films in the above-described techniques self-assemble without any direction or guidance. This undirected self-assembly results in patterns with defects. Because undirected self-assembly results in defects, it is not appropriate for applications requiring long-range ordering, pattern perfection, registration of domains with the underlying substrate and the creation of addressable arrays.

Approaches to long-range ordering of diblock copolymer films include graphoepitaxy, the use of temperature gradients, solvent casting and shear techniques. However, none of these techniques have shown truly macroscopic ordering and perfect or near-perfect registration of the domains with the substrate.

Figure 3A:
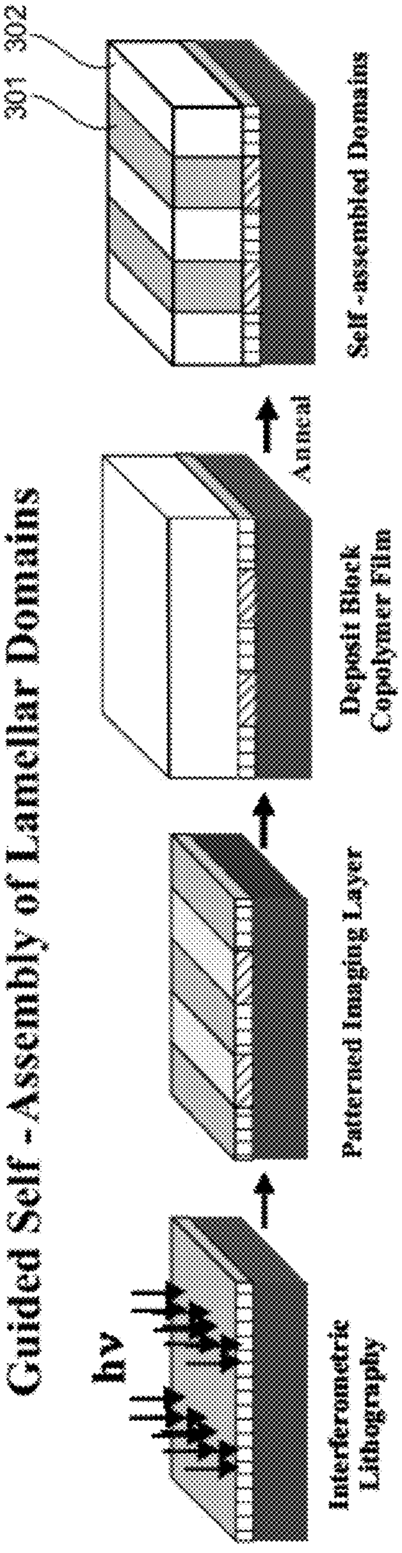
FIGS. 3A and 3B show methods of directing assembly of lamellar and cylindrical copolymer domains on substrates.
Figure 3B:
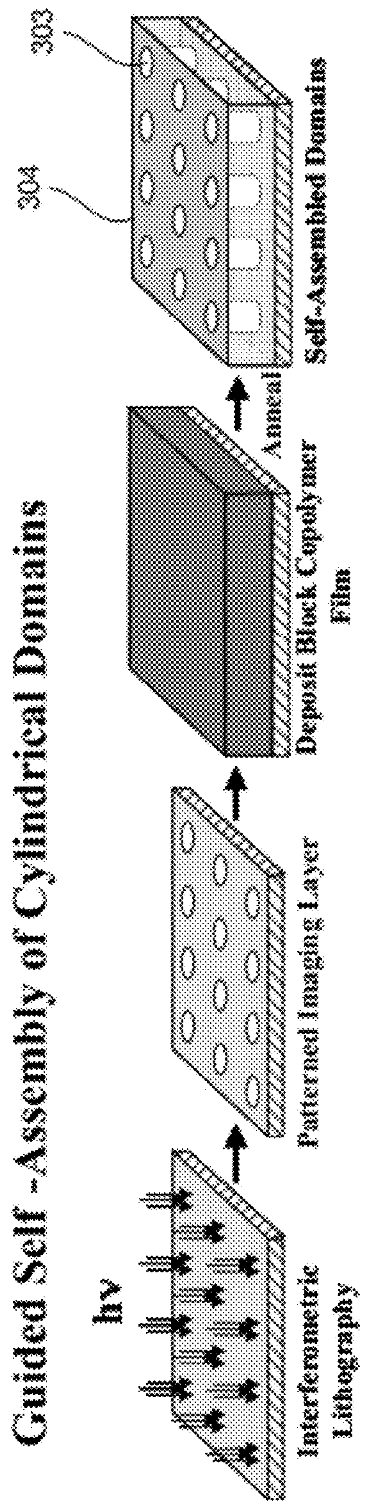

Another approach described in U.S. Pat. No. 6,746,825, herein incorporated by reference in its entirety and for all purposes, combines advanced lithography with self-block copolymer self-assembly. Lithographically patterned surfaces are used to direct assembly of block copolymer domains. The approach achieves macroscopic ordering of the domains with registration of the underlying chemical pattern. FIGS. 3A and 3B show how lamellar and cylindrical domains may be formed on a substrate by this technique. FIG. 3A shows guided self-assembly of lamellar domains on a substrate covered with an imaging layer. In the first step, interferometric lithography is used to create a periodic pattern in the imaging layer. In this case, a linear striped pattern is created. A block copolymer film is then deposited on the patterned imaging layer. The copolymer film is then annealed to form an array of self-assembled domains of one block 301 of the copolymer that are surrounded by the other block 302. Selective functionalization of the patterned structure may then be carried out, for example, by removing one block and then filling the opening with another material. FIG. 3B shows guided self-assembly of cylindrical domains. The process is the same as that lamellar domains, only differing in the pattern created in the imaging layer. In this case, the pattern is a hexagonal array of circles. Cylindrical domains of one block 303 surrounded by the other block 304 are formed.

As mentioned above, interferometry is used to pattern substrates with regions of different chemical functionality in spatial arrangements commensurate with the characteristic dimensions of the domain structure of the block co-polymer. Interferometric patterning is well suited for preparing substrates to guide self-assembly of the morphologies shown in FIG. 2. This is because the interference patterns and the block copolymer morphologies exhibit the same periodicity. Crossing two beams of light, for example, results in the alternating stripes pattern shown in FIG. 3A used to guide the self-assembly of lamellar domains. Double exposure of stripes with an included angle of 120° results in spots of constructive interference in a hexagonal array which are used to guide the self-assembly of cylindrical domains, also shown in FIG. 3B.

Figure 4:
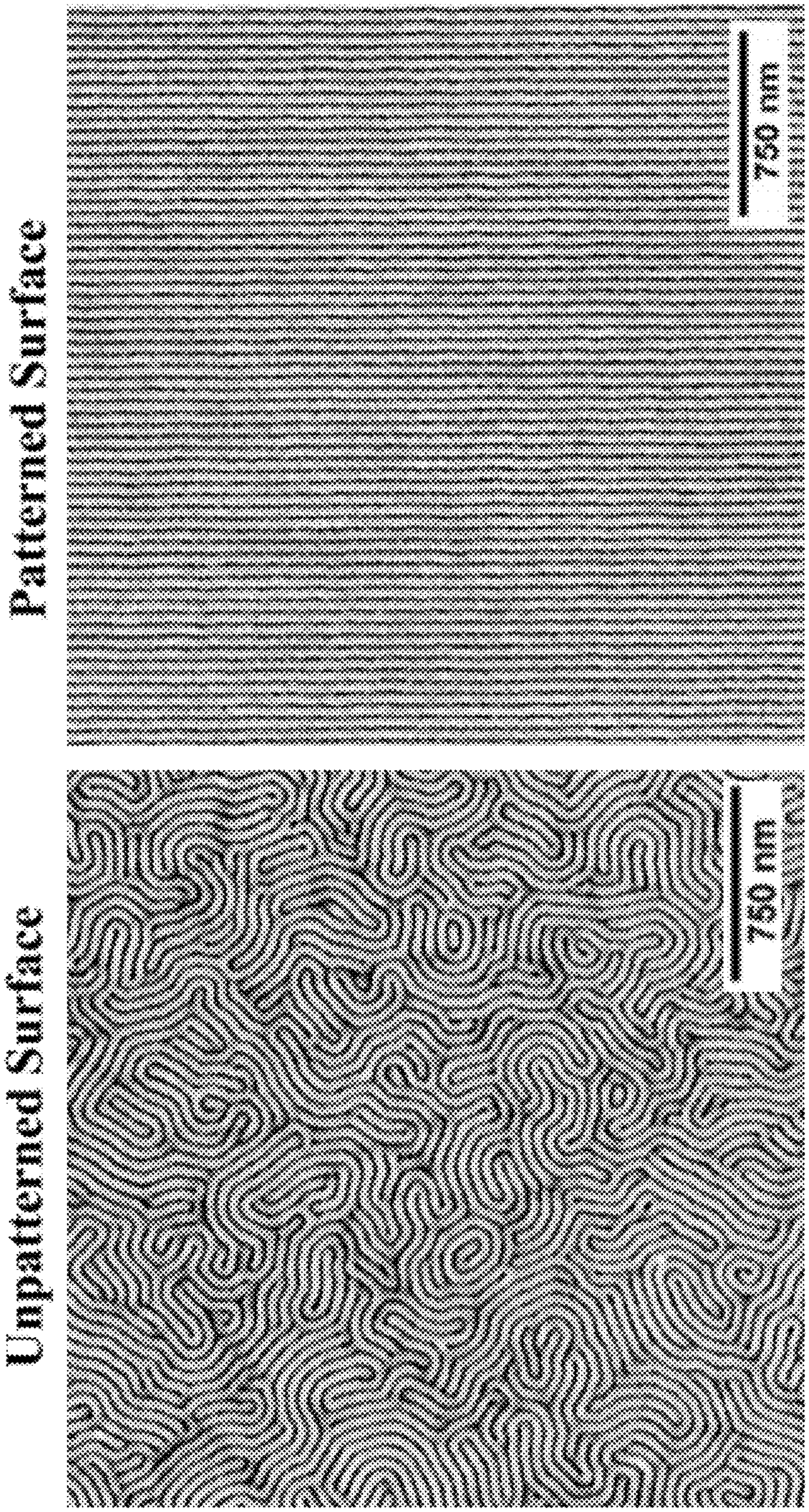
FIG. 4 shows self assembled PS-b-PMMA copolymer on an unpatterned and the patterned substrate.

The difference between undirected and directed assembly over a macroscopic area can be seen in FIG. 4. FIG. 4 shows macroscopic self-assembly of PS-b-PMMA on an unpatterned and on a patterned substrate. As shown in FIG. 4, an unpatterned surface results in disordered assembly of the block copolymer. Utilizing a periodic patterned surface as discussed above results in perfect epitaxial assembly of the block copolymer film. Epitaxial assembly is possible over arbitrarily large areas. In example, perfect epitaxial assembly has been achieved over a rectangular area of 8×5 $\mu m^2$, along linear distances of 50 μm perpendicular to the pattern (the maximum perpendicular dimension of the patterned area) and 400 μm along one lamella.

Guided self-assembly on a pattern surface as shown in FIG. 4 requires some correlation between the block copolymers and the patterns. Block copolymer films have a bulk lamellar period, $L_o$. For diblock copolymers, $L_o$ is the length of one diblock in the bulk. Similarly, periodic patterns have pattern periods. The pattern period $L_s$ of an alternating stripes pattern used to direct diblock lamellar domain assembly is the distance between alternate interfaces on the pattern (i.e. the width of two stripes). For cylindrical and spherical domain structures, the periodicity of the bulk domain structures can be characterized by the distance between the cylinders or spheres in the hexagonal array. Guided self-assembly requires that the pattern period be commensurate with bulk period of the microphase separated block copolymer film.

Figure 5:
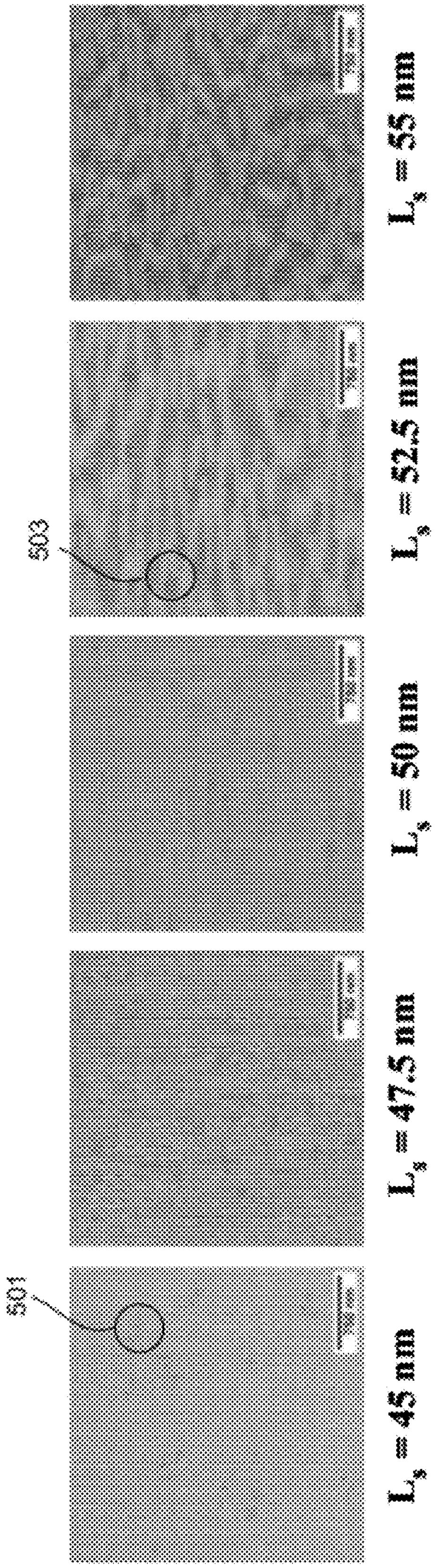
FIG. 5 shows self assembled lamellar domains of PS-b-PMMA on patterned substrates with pattern periods of 45 nm, 47.5 nm, 50 nm, 52.5 nm and 55 nm.

This is demonstrated by FIG. 5, which shows the effects of varying the pattern period $L_s$ on the registration and ordering of lamellar domains of PS-b-PMMA. $L_o$ of symmetric PS-b-PMMA is 48 nm. Directed self-assembly of PS-b-PMMA on pattern periods of 45 nm, 47.5 nm, 50 nm, 52.5 nm and 55 nm is shown in FIG. 5. As shown for $L_s$=45 nm, a pattern period significantly less than the bulk lamellar period of 48 nm results in dislocation defects, such as defect 501. This is because the lamellae are compressed into a smaller area than their bulk period. Pattern periods significantly greater than the bulk lamellar period result in herringbone patterns (e.g., area 503 for $L_s$ of 52.5 nm) and tilted and unregistered lamellae due to the lamellae trying to fit onto an area larger than their natural bulk period. Perfect or near-perfect duplication and registration is achieved for an $L_S$ of 47.5 nm. The more the pattern period $L_s$ differs from the bulk lamellar period, the more defects will be present in the duplicated pattern. Achieving perfect duplication and registration with the substrate pattern requires that $L_s$ be approximately equal to or commensurate with $L_o$. Similarly, the periodicity of the cylindrical and spherical patterns must be commensurate with the period of the bulk microphase separated block copolymer film.

Figure 6A:
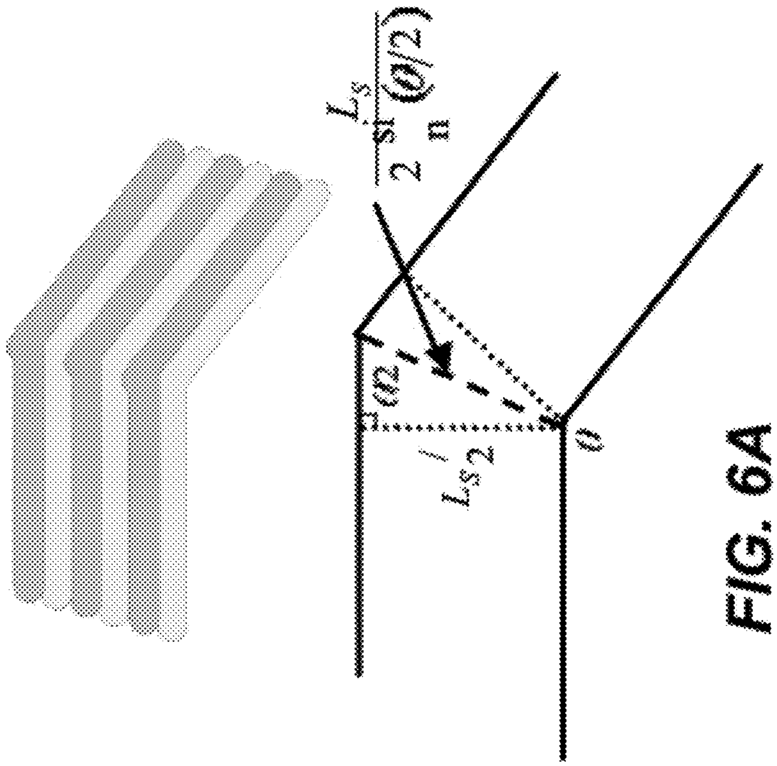
FIG. 6A shows the effective period of a bend in a pattern.
Figure 6:
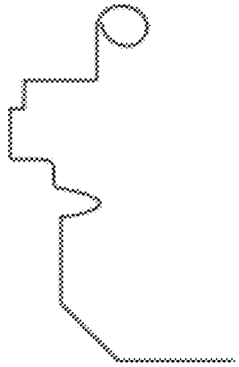
FIG. 6 shows a rough schematic of aperiodic pattern.

Many applications of nanoscale fabrication require patterns that are aperiodic and/or contain irregular features. FIG. 6 shows a rough schematic of an example of such a pattern. Methods that require periodic substrate patterns cannot be used to direct self-assembly of these irregularly-featured or aperiodic patterns. Further, methods where pattern period must be approximately equal to the bulk lamellar period are limited in their application. This is because the effective period is not constant throughout the pattern. FIG. 6A shows the distance between interfaces of an irregular feature (a bend) in a pattern. Assuming a symmetric pattern where the dark and light stripes are of equal width, the distance between interfaces is ½$L_s$ along the linear portions of the pattern. At the bend, however, the distance between interfaces is $L_s/2\sin(\theta/2)$—comparable to having a period of $L_s/\sin(\theta/2)$. Thus the effective period at the bend is $L_s/\sin(\theta/2)$. The nonlinear portions of the pattern in FIG. 6 have different periods than the linear portions. Thus, methods requiring the pattern period to be approximately equal to the bulk lamellar period are not appropriate for duplication of an aperiodic or irregularly-featured pattern such as the one in FIG. 6.

Figure 7:
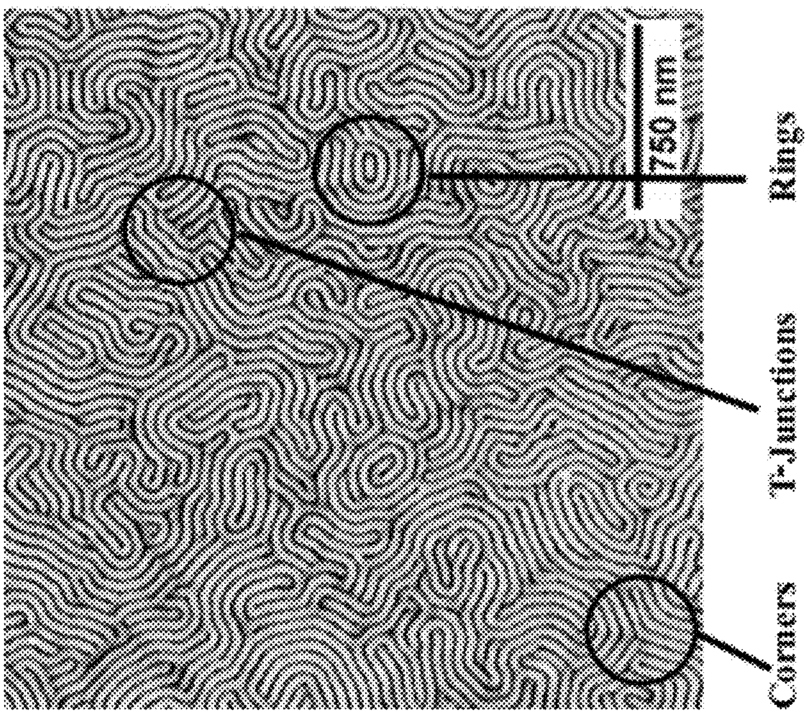
FIG. 7 is an image of irregular features in block copolymer assembled on an unpatterned surface.

Methods of the present invention may be used to replicate the aperiodic patterns or patterns with irregular features in block copolymer layers. FIG. 7 shows a block copolymer film deposited on a neutral wetting (i.e. unpatterned) surface. As can be seen in FIG. 7, many different irregular features can be identified in the film, including corners, t-junctions and rings. For all morphologies, irregular features are features different from the bulk microphase separated domains. In embodiments wherein the block copolymer material exhibits lamellar morphology, irregular features include all non-linear features, including corners, angles, t-junctions and rings. In embodiments wherein the block copolymer material exhibits parallel cylindrical array morphology, irregular features also include all non-linear features. The methods of the present invention may be used to replicate a pattern containing any irregular feature found in the chaotic structure of an undirected block copolymer film. In some embodiments, the methods of the invention may be used to replicate a pattern containing both aperiodic and periodic regions. In some embodiments, the methods of the invention may be used to replicate patterns containing both irregular features and features corresponding to the bulk microphase separated domains (such as those depicted in FIG. 2).

Figure 8:
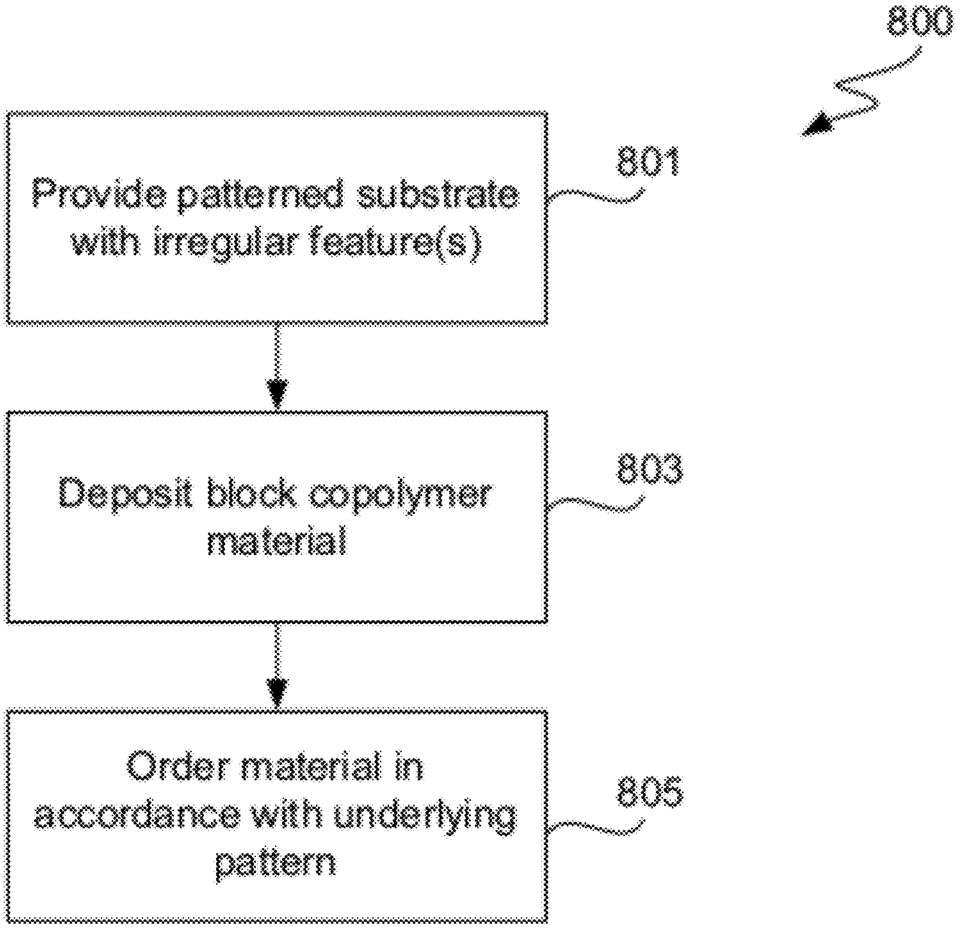
FIG. 8 is a flowchart showing a process of replicating an aperiodic pattern on a substrate according to one embodiment of the invention.

FIG. 8 is a flowchart showing the operations of a process 800 according to one embodiment of the invention. At operation 801, a patterned substrate having irregular features is provided. The substrate may be chemically patterned or otherwise activated. At operation 803, a layer of material comprising a block copolymer is deposited on the substrate. For example, the material may be a block copolymer/homopolymer blend. Components of the block copolymer material are then ordered in accordance with the underlying pattern in operation 805 to replicate the pattern in the copolymer layer. To induce ordering, the block copolymer material is typically annealed above the glass transition temperature of the blocks of the copolymer material.

Figure 9:
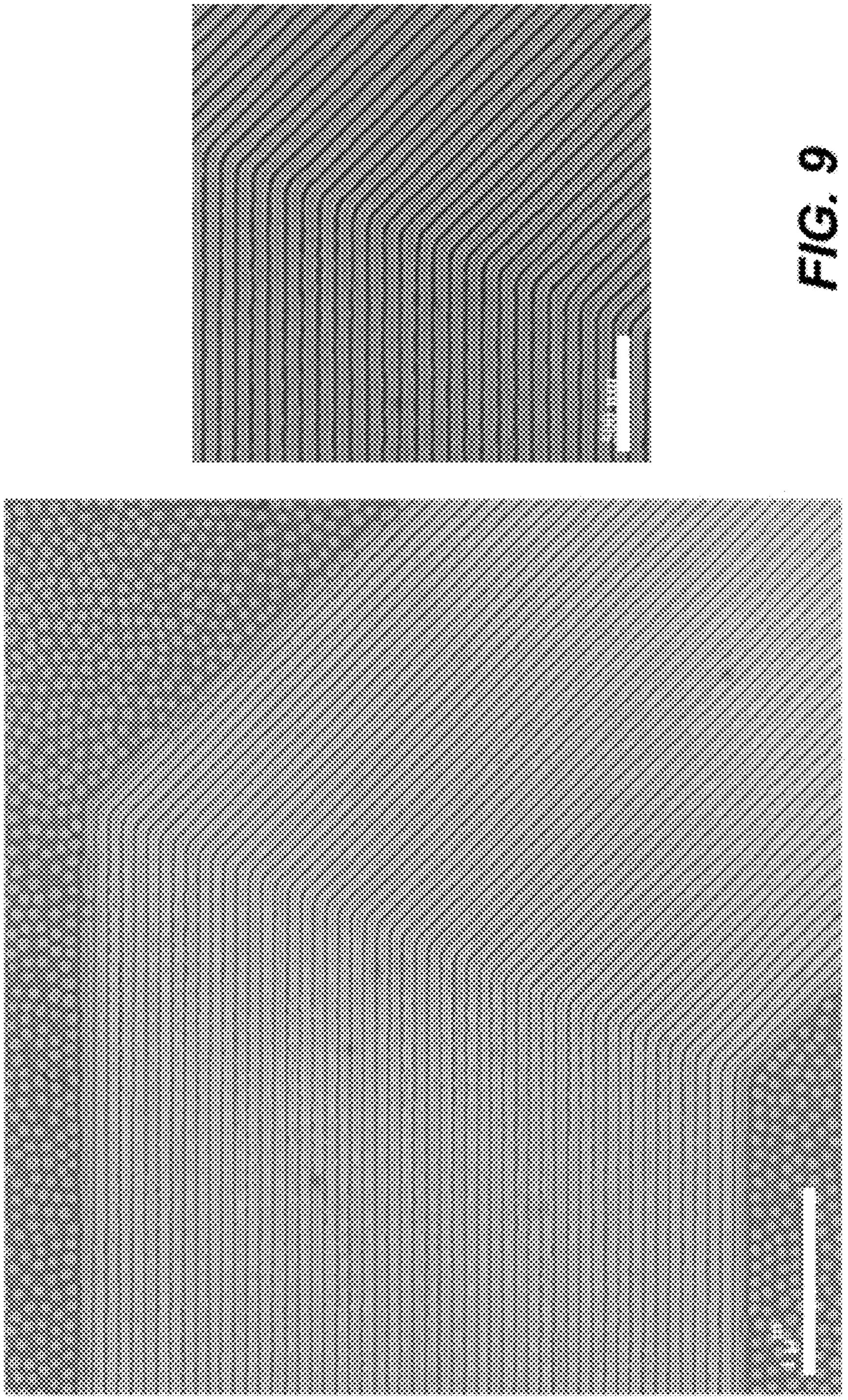
FIG. 9 shows a block copolymer film performed on a pattern substrate in accordance with one embodiment of the invention.

FIG. 9 shows a block copolymer film formed on a patterned substrate in accordance with an embodiment of the invention. The pattern contains an irregular feature, i.e. a 135° angle bend. As can be seen in FIG. 9, the method produces perfect or near-perfect duplication and registration with the underlying pattern. This is true even at the bend (shown close-up in the 500 nm image.)

Figure 10A:
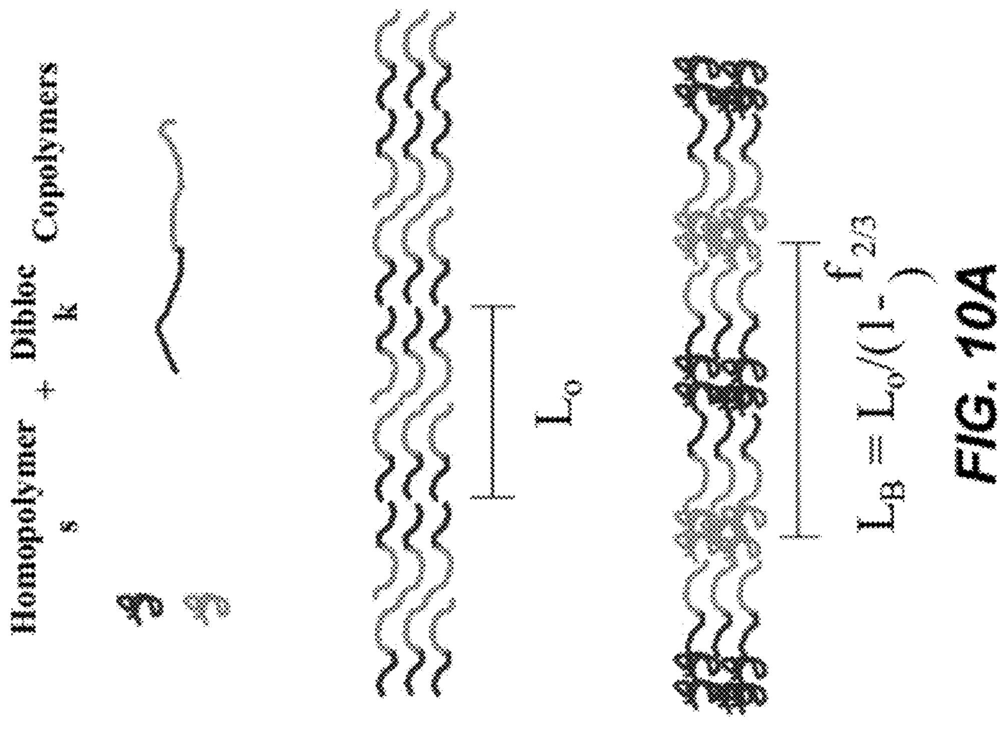
FIGS. 10A and 10B show bulk lamellar periods of copolymer/copolymer and copolymer/homopolymer blends.
Figure 10B:
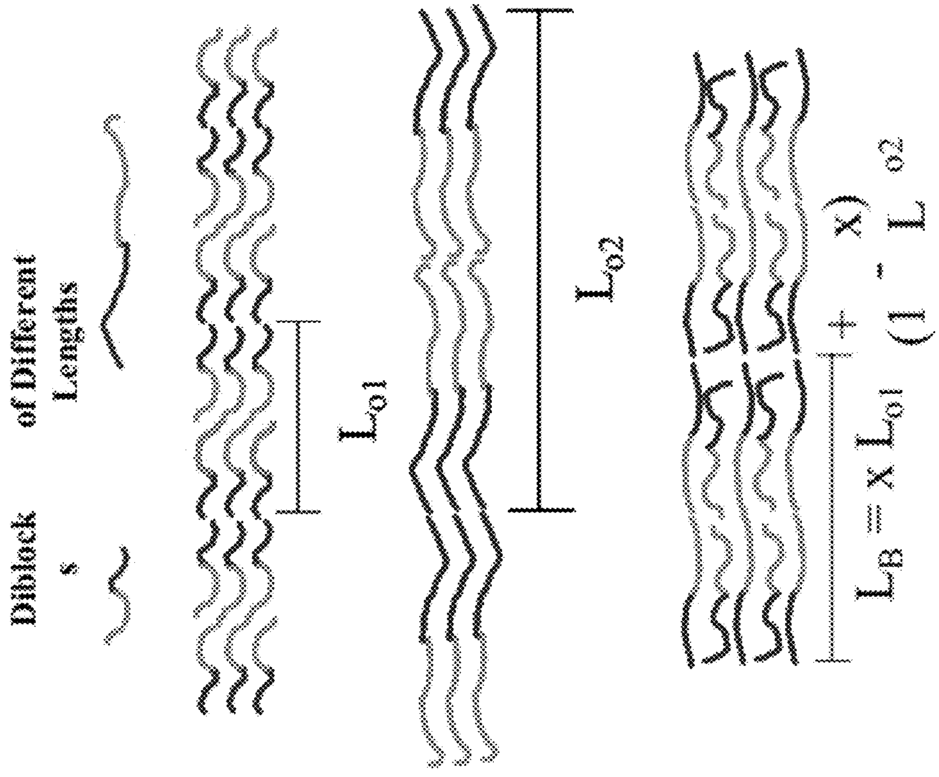

According to various embodiments, ordering of the copolymer in accordance with the aperiodic pattern is facilitated through the use of blends of the copolymer material. FIGS. 10A and 10B show how target feature size may be shifted through the use of block copolymer/block copolymer or block copolymer/homopolymer blends. For example, one can shift the period of the copolymer material by blending the block copolymer with another block copolymer of a different length as shown in FIG. 10B. Block copolymer 1 has a bulk lamellar period $L_{o1}$ and block copolymer 2 has a bulk lamellar period $L_{o2}$. The resulting period of the blend, $L_B$, is a function of the periods $L_{o1}$, and $L_{o2}$ of the diblocks, and the composition of the blend. Homopolymers may also be blended with the block copolymer in the copolymer material as shown in FIG. 10A. The block copolymer has a period $L_o$. The resulting period of the blend, $L_B$, is a function of the period of the diblock copolymer period $L_o$ and the composition of the blend.

Figure 11:
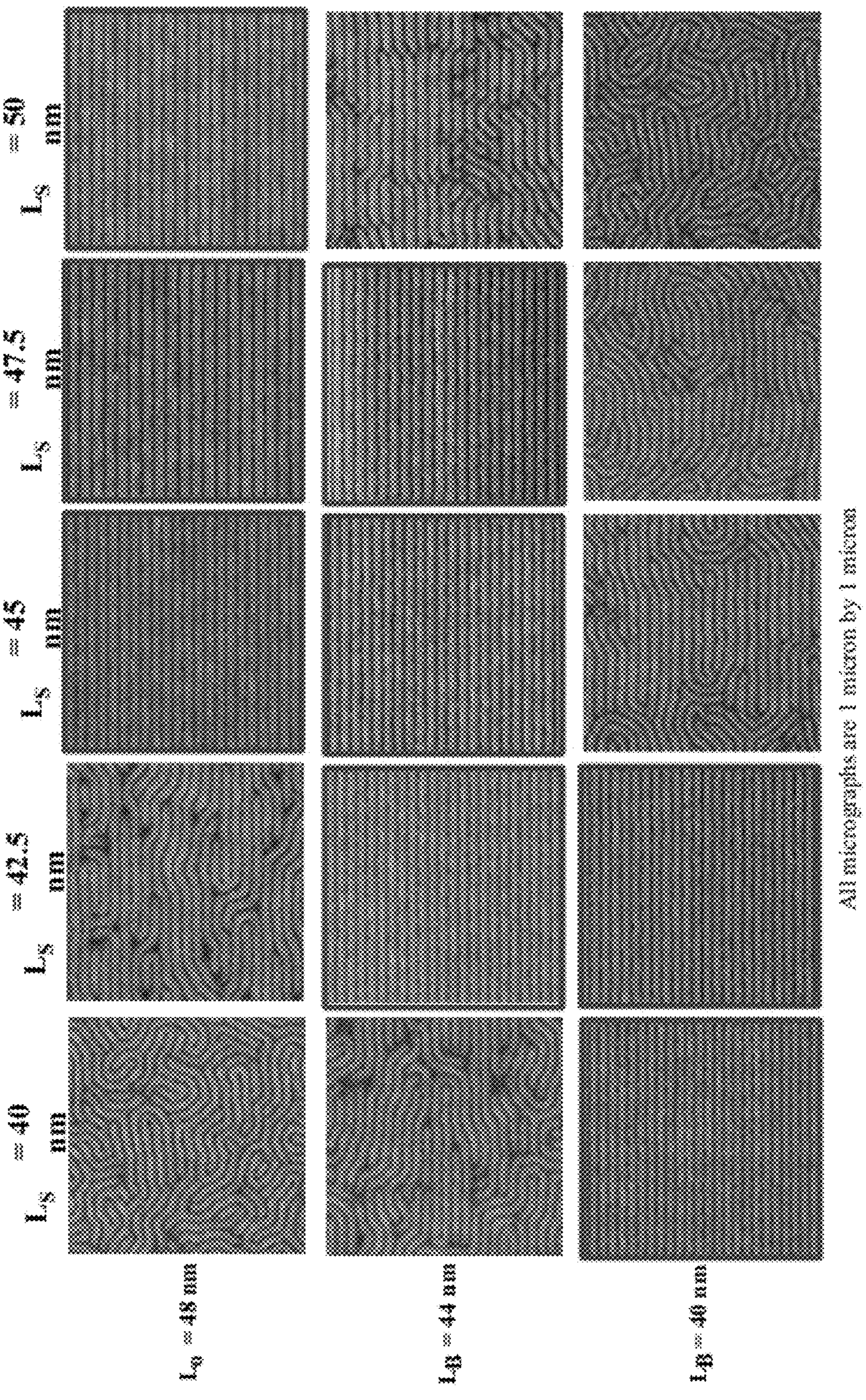
FIG. 11 shows the results of deposition of copolymer blends of periods of 40 and 44 nm and unblended copolymer material of period 48 nm on patterned surfaces of 40 nm, 42.5 nm, 45 nm, 47.5 nm and 50 nm.

Blends may be used to duplicate patterns of any period. FIG. 11 shows layers of unblended block copolymer ($L_o$=48 nm) and two blends ($L_B$=44 nm and $L_B$=40) deposited on substrates with pattern periods of 40 nm, 42.5 nm, 45 nm, 47.5 nm and 50 nm. For substrate pattern with a period of 50 nm, good ordering was achieved with the unblended block copolymer of $L_o$=48 nm. Both the 45 nm and 47.5 nm patterns were well-ordered with use of the unblended copolymer and the 44 nm blend. For the substrate pattern with $L_s$=42.5 nm, good ordering was achieved with use of each of the blends and the $L_s$=40 nm was well-ordered when covered with the 40 nm blend. The results show that it is possible to achieve good ordering of a block copolymer blend on a substrate pattern of a particular period by appropriately blending the material. Blends may used to improve ordering of periodic (as shown in FIG. 11) and aperiodic patterns by tailoring the material used to the particular period or (range of effective periods) in the pattern.

Figure 12:
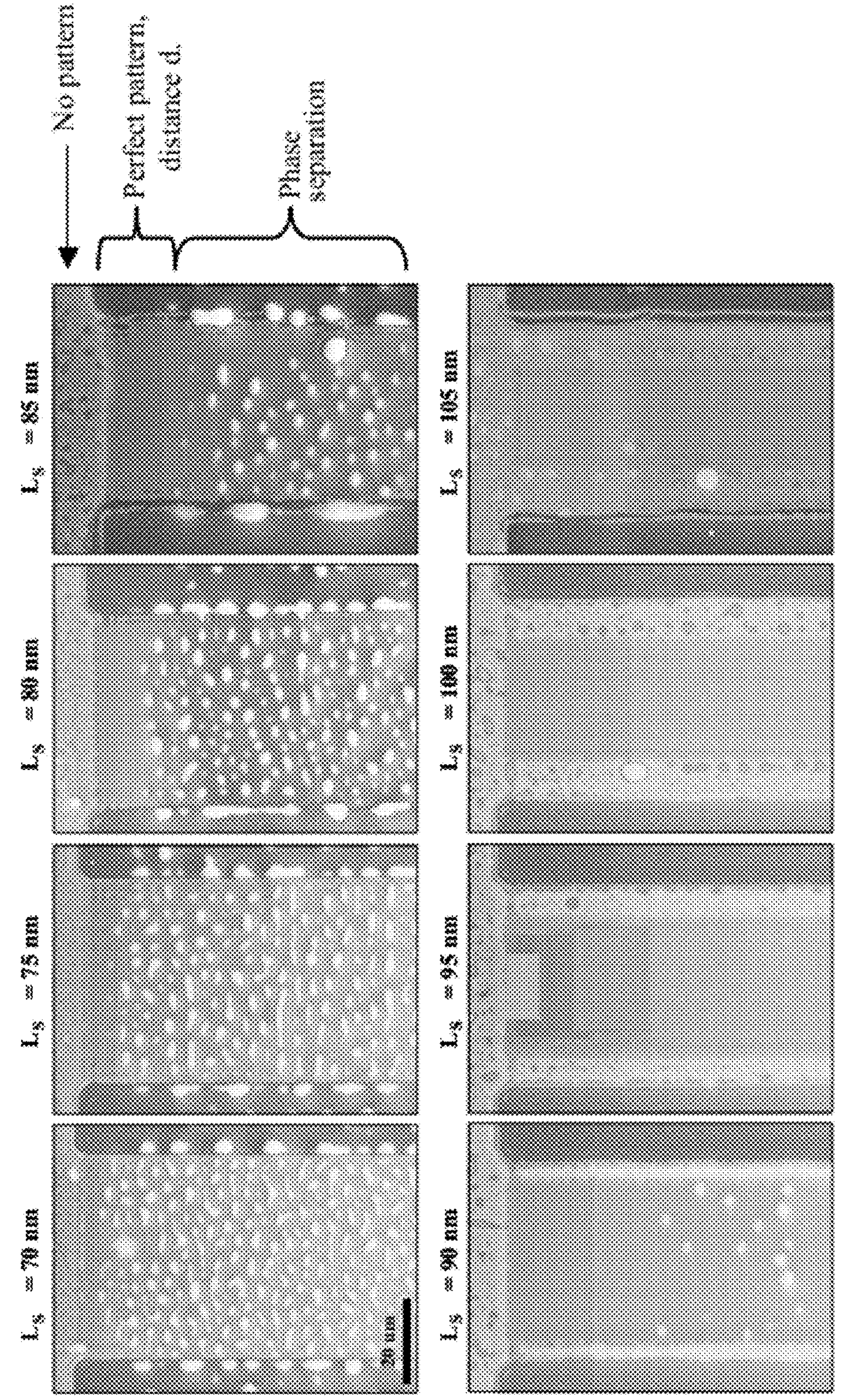
FIG. 12 shows the results of deposition of a PS-b-PMMA/PS/PMMA blend on patterned substrates with pattern periods ranging from 70 nm to 105 nm.

In preferred embodiments, the blend contains a homopolymer or other swellable material. FIG. 12 shows results of deposition of a blend of PS-b-PMMA block copolymer with PS and PMMA homopolymers on substrates with pattern periods ranging from 70-105 nm. The homopolymer volume fraction $\phi$H in the PS-b-PMMA/PS/PMMA blend was 0.6. The blend period $L_B$ was around 100 nm.

Deposition on substrate patterns of 95 nm-105 nm resulted in well-ordered duplication and registration of the striped pattern (the pattern features cannot be distinguished because of the scale of the image (about 40 μm/inch). This is because the pattern period $L_S$ is commensurate with the blend period $L_B$ of about 100 nm.

However, deposition on substrate patterns with lower periods (i.e. 90 nm, 85 nm, 80 nm, 75 nm and 70 nm) exhibits phase-separated domains of homopolymer. These are the white spots on the images. However, near the top of each image there is also an area of perfect patterning of distance d. The amount of phase separation of the homopolymer and the distance of perfect patterning, d, is a function of the pattern period $L_s$. The area outside the patterned area acts as a reservoir to which excess homopolymer can flow. Thus, although the blend has a ϕH of 0.6, the perfectly patterned area has a ϕH of less than 0.6.

The ability of the homopolymer to diffuse, leaving an area of perfect patterning at any particular pattern period suggests that virtually any substrate pattern can be accommodated by the correct blend. With such a blend, the homopolymer could diffuse from a pattern feature, for example, with a small effective period to a pattern feature with a large effective period. The larger pattern period region would accommodate the homopolymer without phase separation. Both the small and large period areas would be patterned by the blend. For example, a ternary PS-b-PMMA/PS/PMMA (0.6/0.2/0.2 volume fraction) blend with $L_B$ of 70 nm resulted in perfectly ordered and registered lamellae on surfaces having $L_S$ ranging from 60 to 80 nm. (See Stoykovich, M. P., Müller, M., Kim, S. O., Solak, H. H., Edwards, E. W., de Pablo, J. J., Nealey, P. F., Directed Assembly of Block Copolymer Blends into Non-regular Device Oriented Structures, *Science* (accepted for publication, 2005), which is hereby incorporated by reference in its entirety and for all purposes.

Figure 21A:
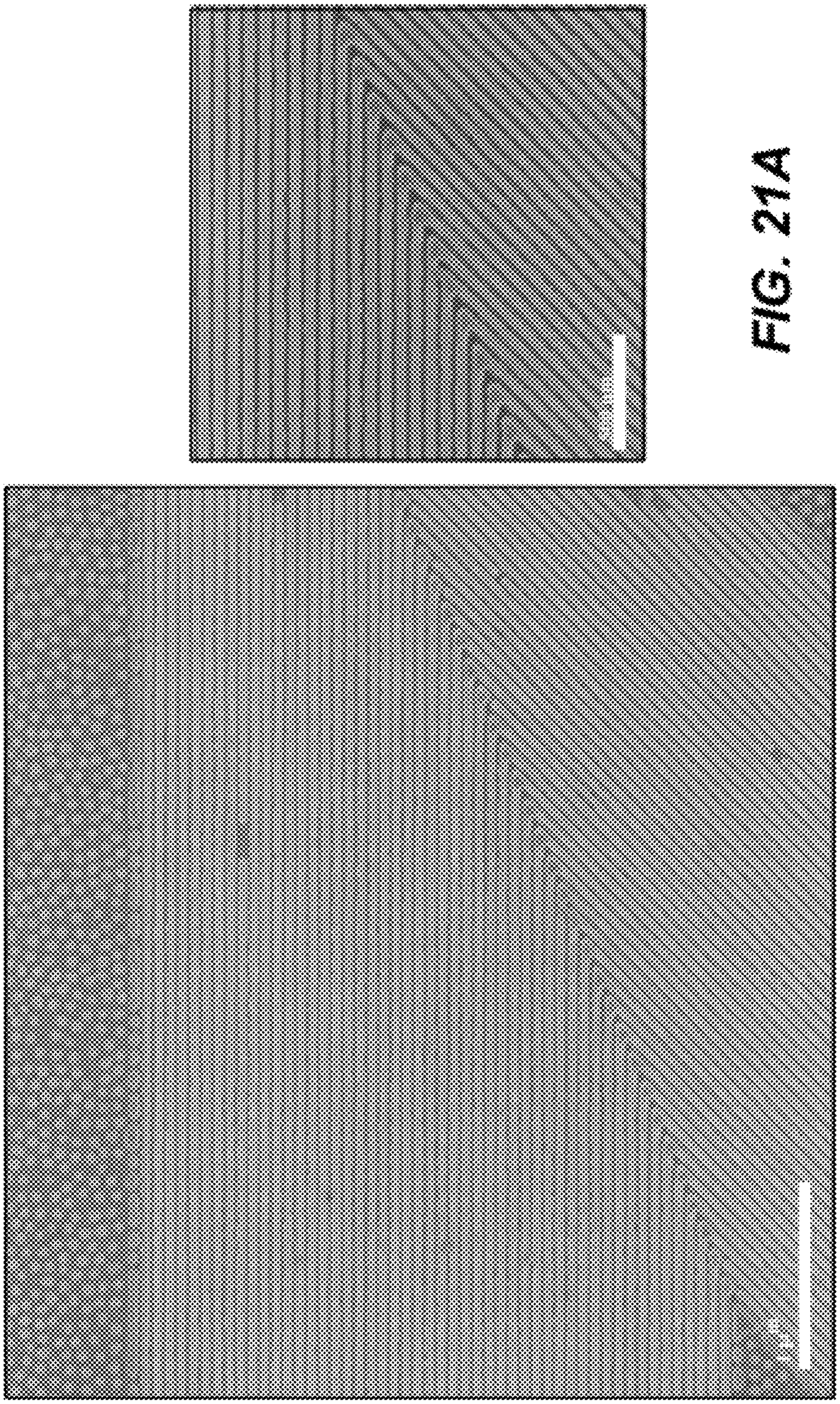
FIGS. 21A-D are images of replicated patterns containing 45° bends.
Figure 21B:
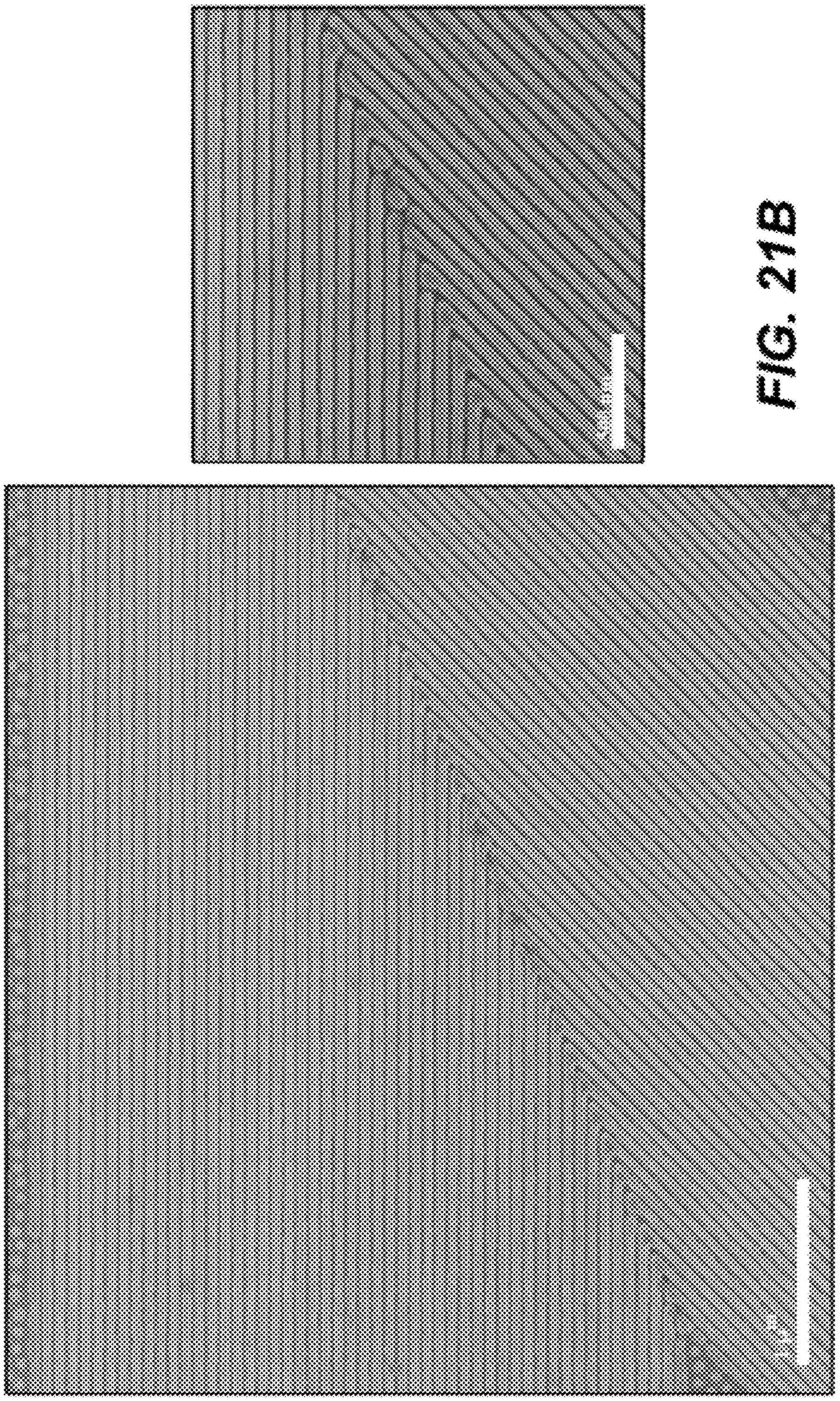
Figure 21C:
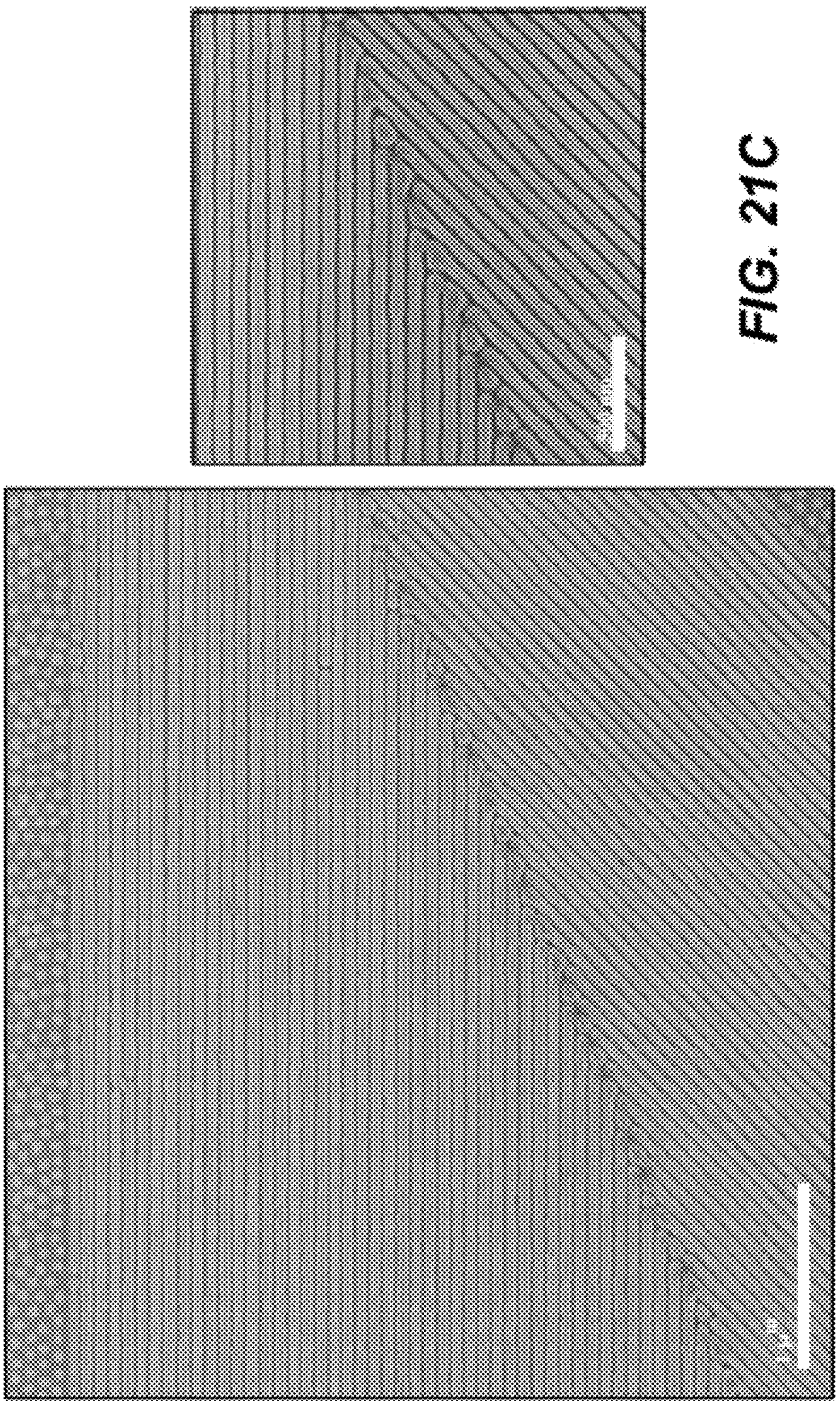
Figure 21D:
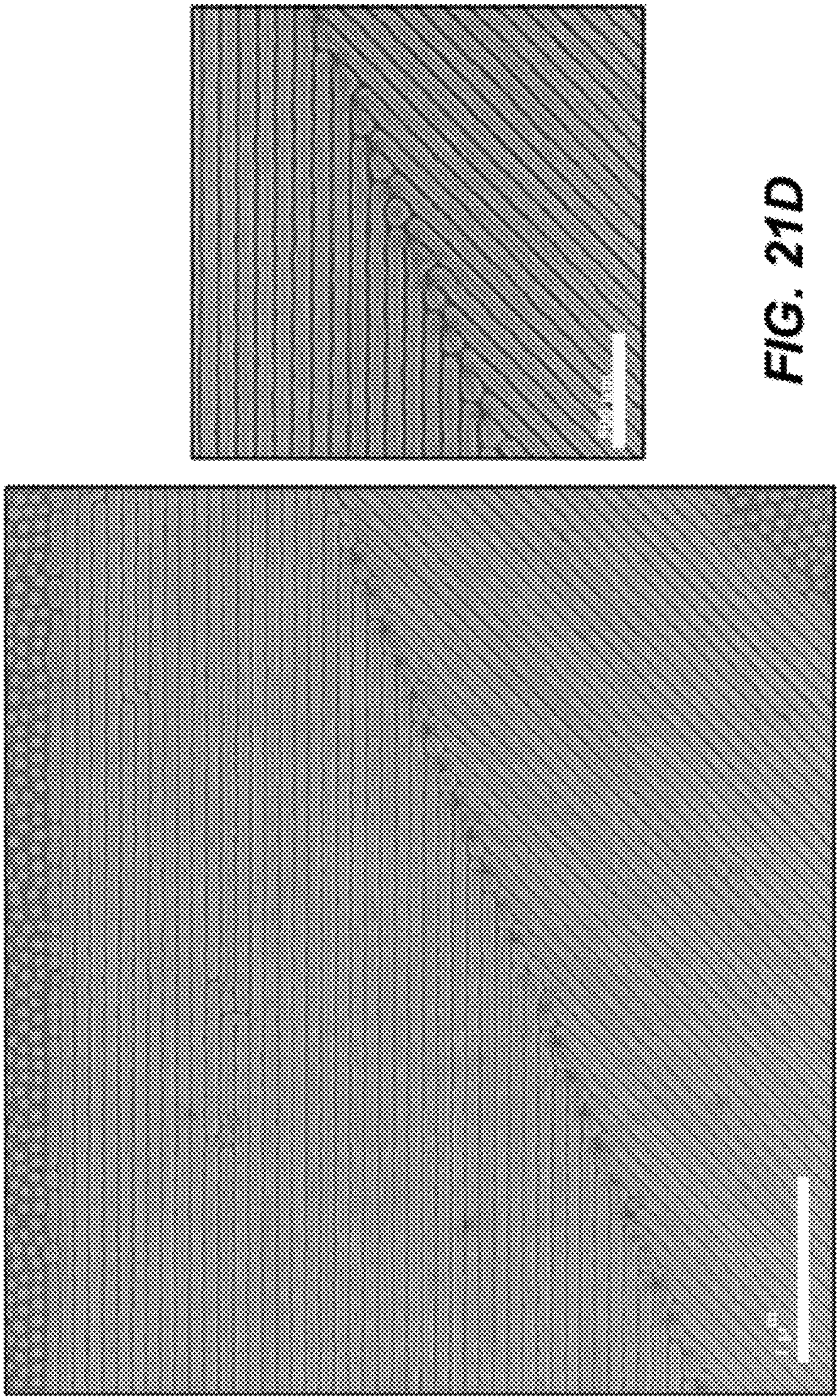

Another example of this is shown in FIG. 21A, which is an image of directed self-assembled copolymer material on a pattern containing a 45° bend. The pattern period is 65 nm along the linear portions of the pattern. As discussed above in the context of FIG. 6A, the effective pattern period at the bend is $L_s/\sin(\theta/2)$ or approximately 170 nm. The bulk lamellar period of the blend was 70 nm. Dark areas on the light stripes appear at the bend. While the invention is not limited by this theory, these dark areas are believed to indicate the concentration of the homopolymer at the bend. Homopolymer diffused from the 65 nm region of the pattern to the bend. The larger area at the bend requires more material, which that was supplied by the diffused homopolymer. This effect is also discussed in Stoykovich et al. (referenced above).

The appropriate blend composition for a desired pattern can be determined by matching the volume fraction of a polymer in a blend to the “light” or “dark” area fraction of the pattern. For example, if the “dark” area fraction of a pattern is 0.6, a ternary blend of PA-b-PB/PA/PB could be fixed so that volume fraction of A in the blend would be 0.6. In some embodiments, a reservoir may be provided to supply or take up homopolymer as needed. The reservoir may or may not be a functional part of the pattern.

The block copolymer may be blended with any number of copolymers and/or any number of homopolymers but is not limited to blending with copolymers and homopolymers. For example, the block copolymer may be blended with any swellable material that would have the ability to diffuse to regions of the pattern requiring more material. Examples of swellable materials include non-volative solvents, plasticizers, supercritical fluids or any other diluent. As with homopolymers, a reservoir may be provided to supply or take up the swellable material.

In some embodiments of the invention, ordering of the copolymer in accordance with the pattern, including aperiodic or irregularly-featured patterns, is facilitated through the configuring of substrate patterns so that regions of the substrate pattern interact in a highly preferential manner with at least one of the components in the copolymer material.

The preferential interaction may be based on any property of the substrate pattern material and/or the copolymer material. In some embodiments, a region of the substrate pattern interacts with a component of the copolymer film due to the interfacial energy between them. For example, if the block copolymer material is a PS-b-PMMA block copolymer, the substrate pattern may be configured so that a region of the pattern is highly preferential to either PS or PMMA. This may be done by tailoring the composition of the substrate pattern.

Figure 13:
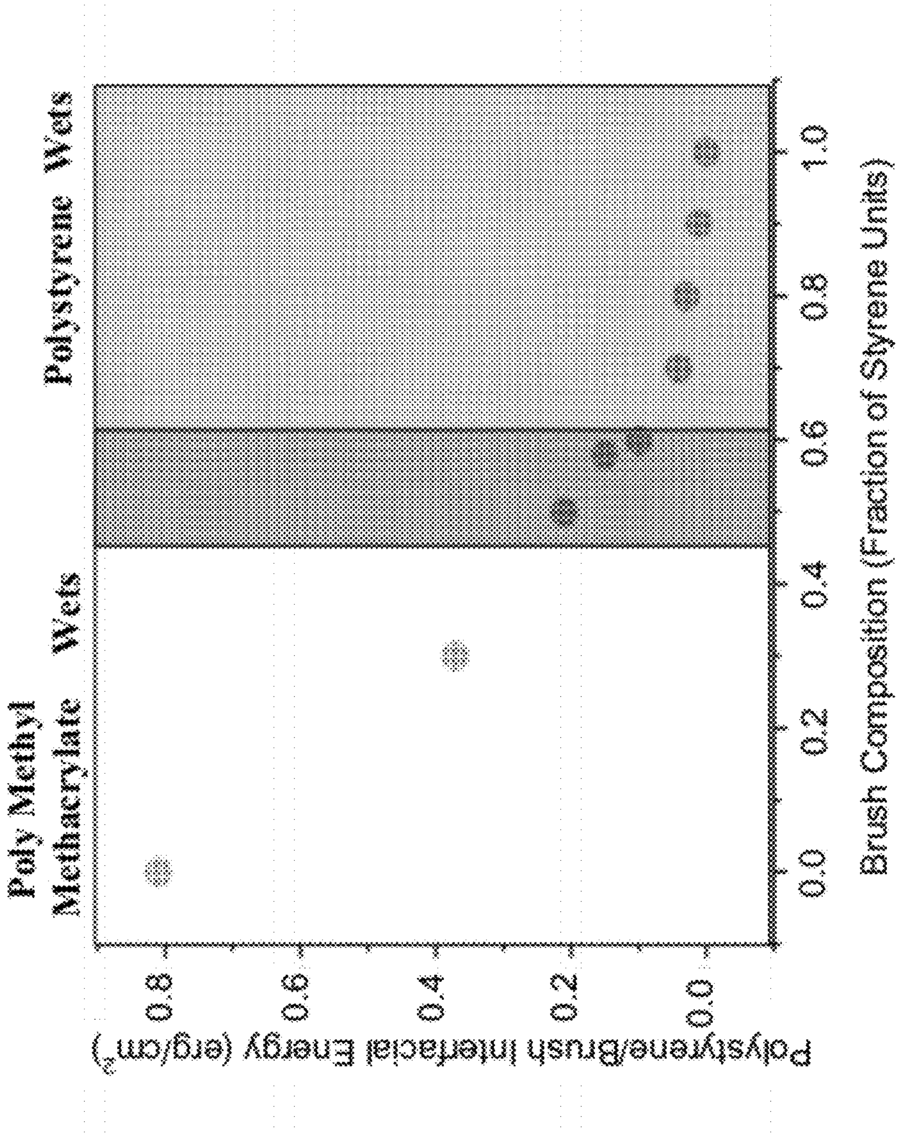
FIG. 13 shows the interfacial energy between polystyrene and the random styrene/methyl methacrylate brush as function of brush composition.

FIG. 13 shows interfacial energy between polystyrene and a random styrene/methyl methacrylate copolymer brush as a function of the composition of the brush. As the fraction of styrene in the brush decreases, the interfacial energy between the polystyrene and the brush increases (see Mansky et al., Science, 1997, 275, 1468, which is hereby incorporated by reference in its entirety.) The wetting behavior of block copolymer thin films has been shown to depend upon the interfacial energy between each block of the copolymer and the substrate, with the block having the lower interfacial energy preferentially wetting the substrate.

Figure 14:
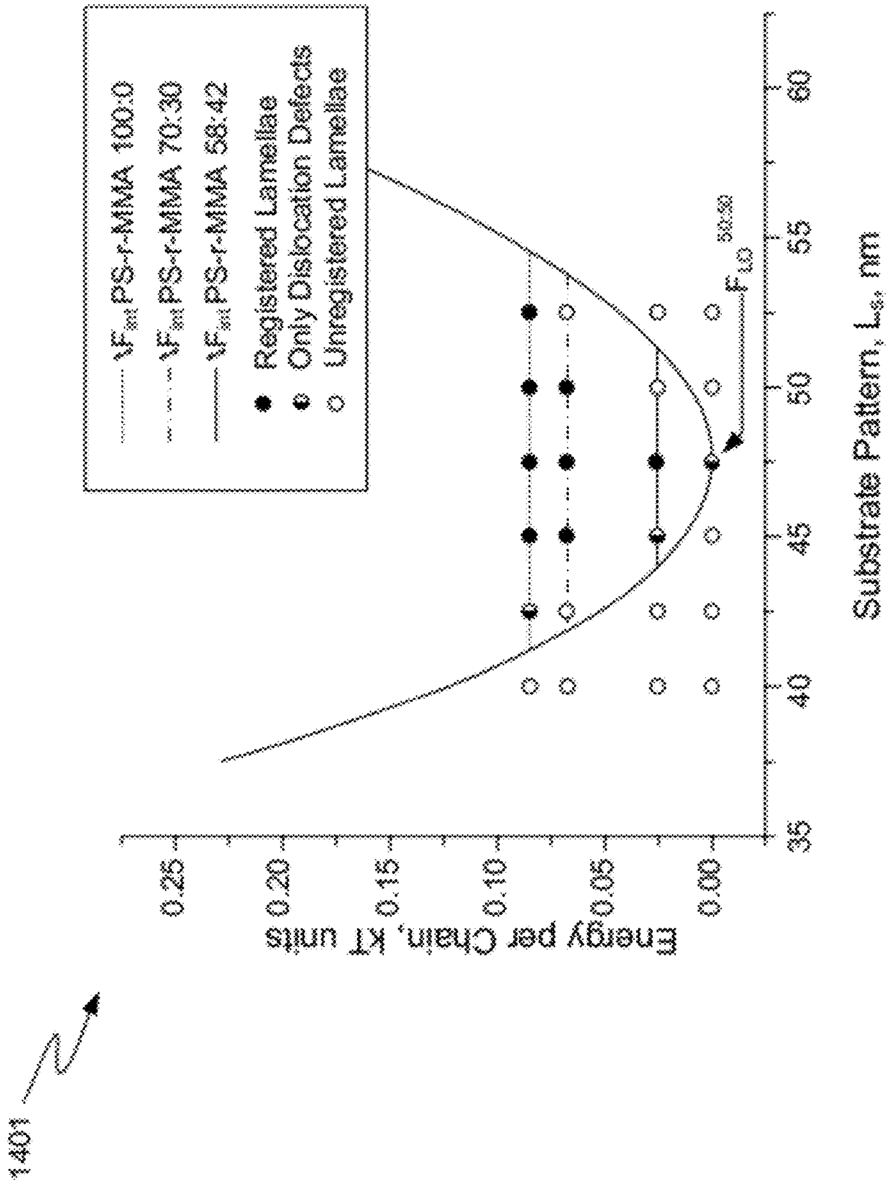
FIG. 14 is a graph showing the energy required to stretch/compress copolymer blocks as a function of substrate pattern period.

In some embodiments, one or more components of the copolymer material may be stretched or compressed to facilitate registration with the underlying pattern. Compression may occur when the bulk lamellar period of the copolymer material is greater than that of the pattern. Stretching may occur when the bulk lamellar period of the copolymer material is less than that of the pattern. Stretching and compressing the components of the block copolymer allows them to register with a wider range of substrate pattern periods. However, compression and stretching require energy. FIG. 14 shows a graph 1401 showing the energy required to stretch/compress the copolymer blocks as a function of substrate pattern period $L_s$ (see Advanced Materials, 16(15), 1315-1319, 2004, hereby incorporated by reference in its entirety and for all purposes). The parabolic line may correspond to a polymer brush substrate pattern region. As long as the interfacial energy contrast is within the parabola, the block copolymer can register with the underlying pattern (by compressing and/or stretching components of the copolymer material). Thus, increasing the interfacial energy contrast results in registration of the block copolymer film over a larger range of substrate pattern periods.

Figure 15A:
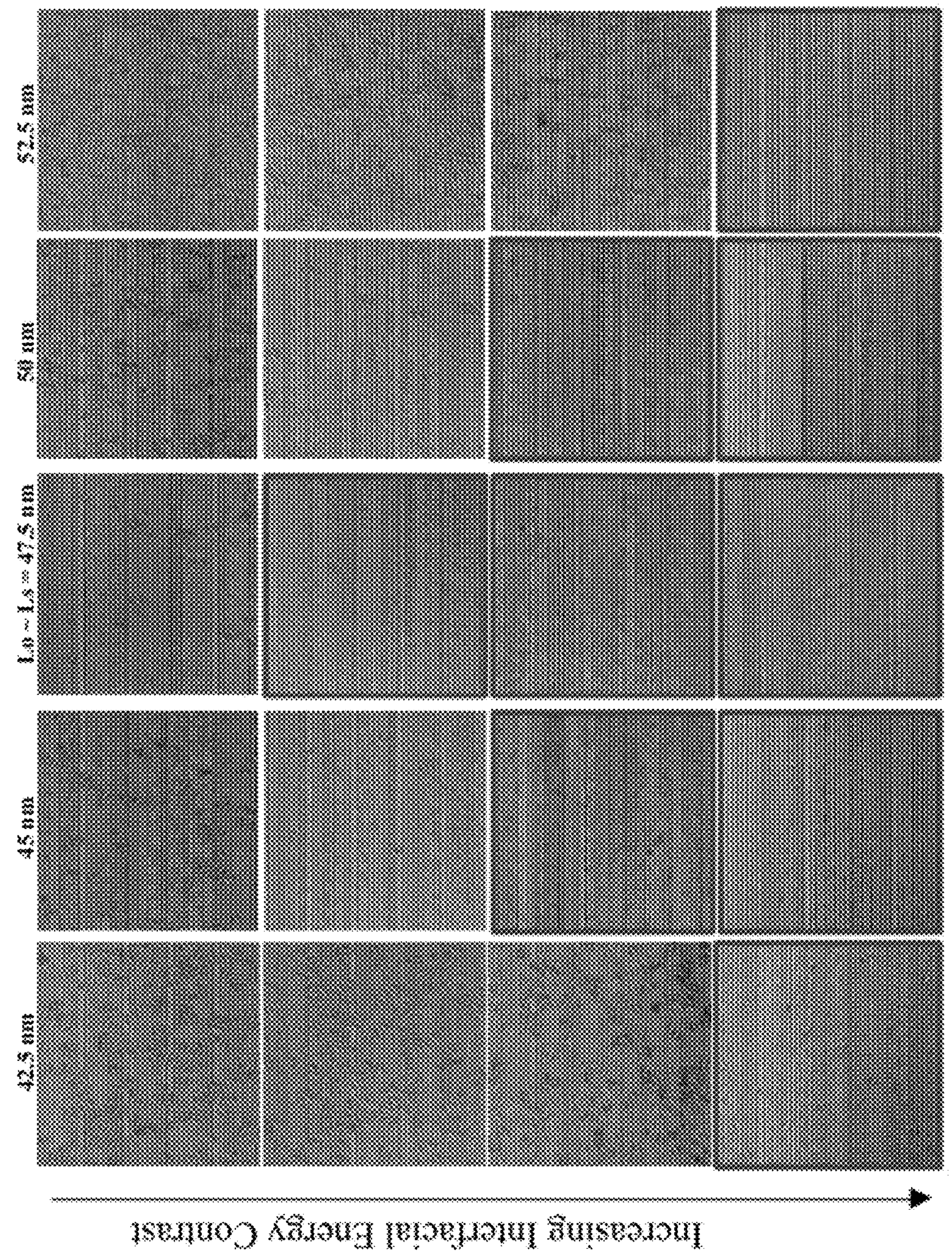
FIG. 15A shows block copolymer films of period 48 nm deposited on substrates of pattern periods of 42.5 nm 45 nm 47.5 nm and 50 nm and 52.5 nm for various interfacial energy contrasts.

The improvement in process latitude that comes with increasing interfacial energy contrast is shown in FIG. 15A. FIG. 15A shows block copolymer films of $L_o$=48 nm deposited on substrates with pattern periods of 42.5 nm, 45 nm, 47.5 nm, 50 nm and 52.5 nm for various interfacial energy contrasts. At the lowest interfacial energy contrast, all of the films show at least some defects, including where $L_s$ is approximately equal to the $L_o$ of 48 nm. As the interfacial energy contrast increases, the films become more ordered. At the highest interfacial energy contrast, the copolymer film is well ordered even on a substrate pattern period of 52.5 nm. Thus, increasing interfacial energy contrast increases process latitude and may be used advantageously with all (periodic and aperiodic) patterns.

Figure 15B:
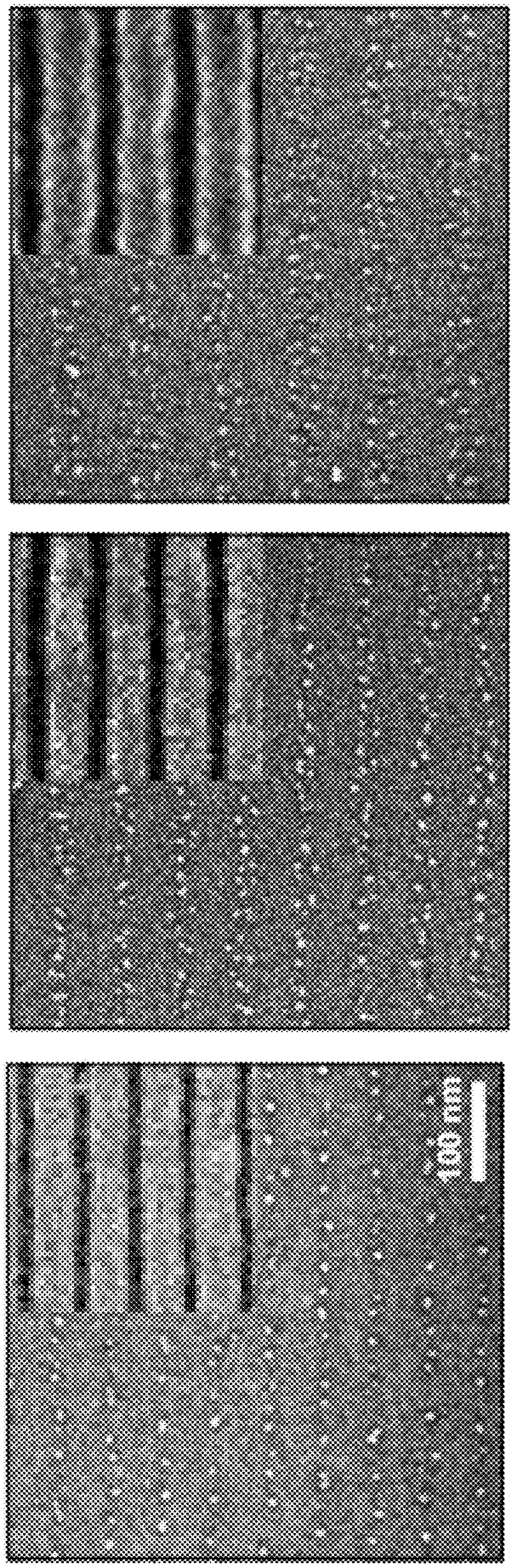
FIG. 15B shows CdSe nanoparticles selectively aligned using block copolymer materials on substrates having different patterns.
Figure 23C:
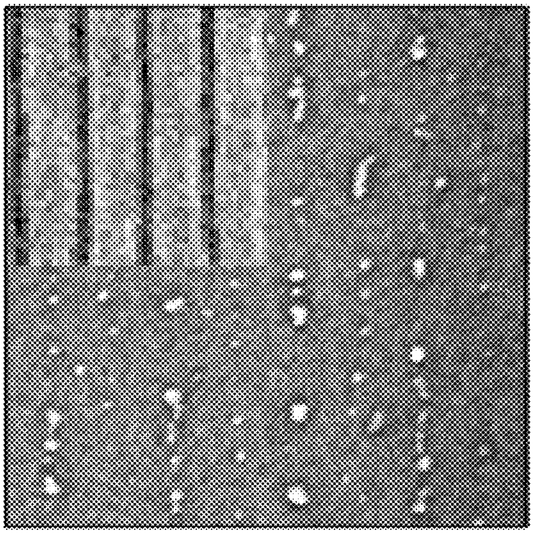
FIGS. 23A-C show SEM images of a block copolymer material containing nanoparticles as ordered on a patterns having various periods.
Figure 23B:
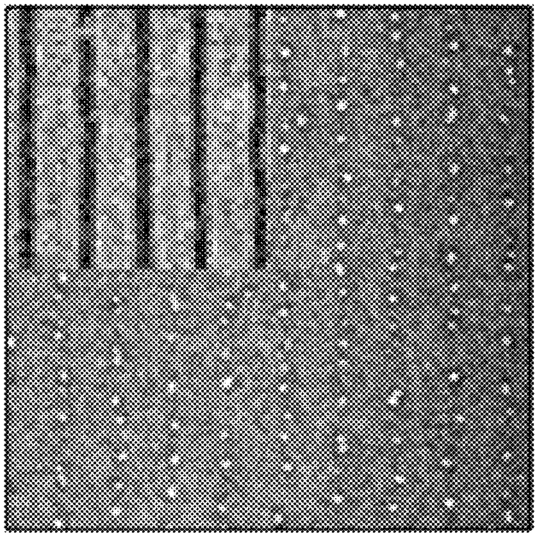
Figure 23A:
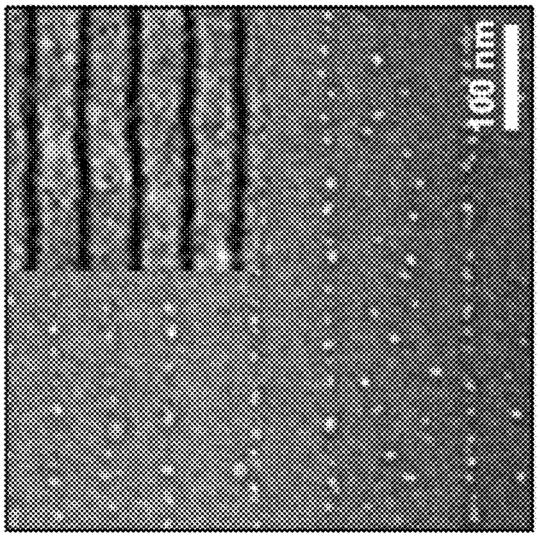

Another example of the improvement in process latitude is shown in FIG. 15B, which shows CdSe nanoparticles selectively aligned using a block copolymer material. Nanoparticles are one example of a diluent that may be included in the copolymer material. They can be chosen based to surface chemistry to selectively agglomerate in one of the phases or components of copolymer material, or at the interface of the phases. When the copolymer material is deposited and ordered, the nanoparticles are selectively aligned with that phase (or at the interface). In some embodiments, the copolymer material used to deposit the nanoparticles is then removed, leaving the nanoparticles in the desired pattern. The improvement in process latitude described above thus also extends to selectively aligning nanoparticles. This is shown in FIG. 15B, which shows stripes of nanoparticles of three different widths. The pattern periodicity of the chemically patterned substrate is 55 nm, 60 nm and 75 nm, respectively (from left to right). By appropriately selecting the material used to align the nanoparticles, it is possible to selectively align nanoparticles in any desired pattern. Examples of other nanoparticles that may be deposited include gold, silver and silicon nanoparticles. Improvement in process latitude for aligning nanoparticles is also shown in FIGS. 23A-C, which show nanoparticles aligned on substrate patterns having different periods using one copolymer material.

Figure 16:
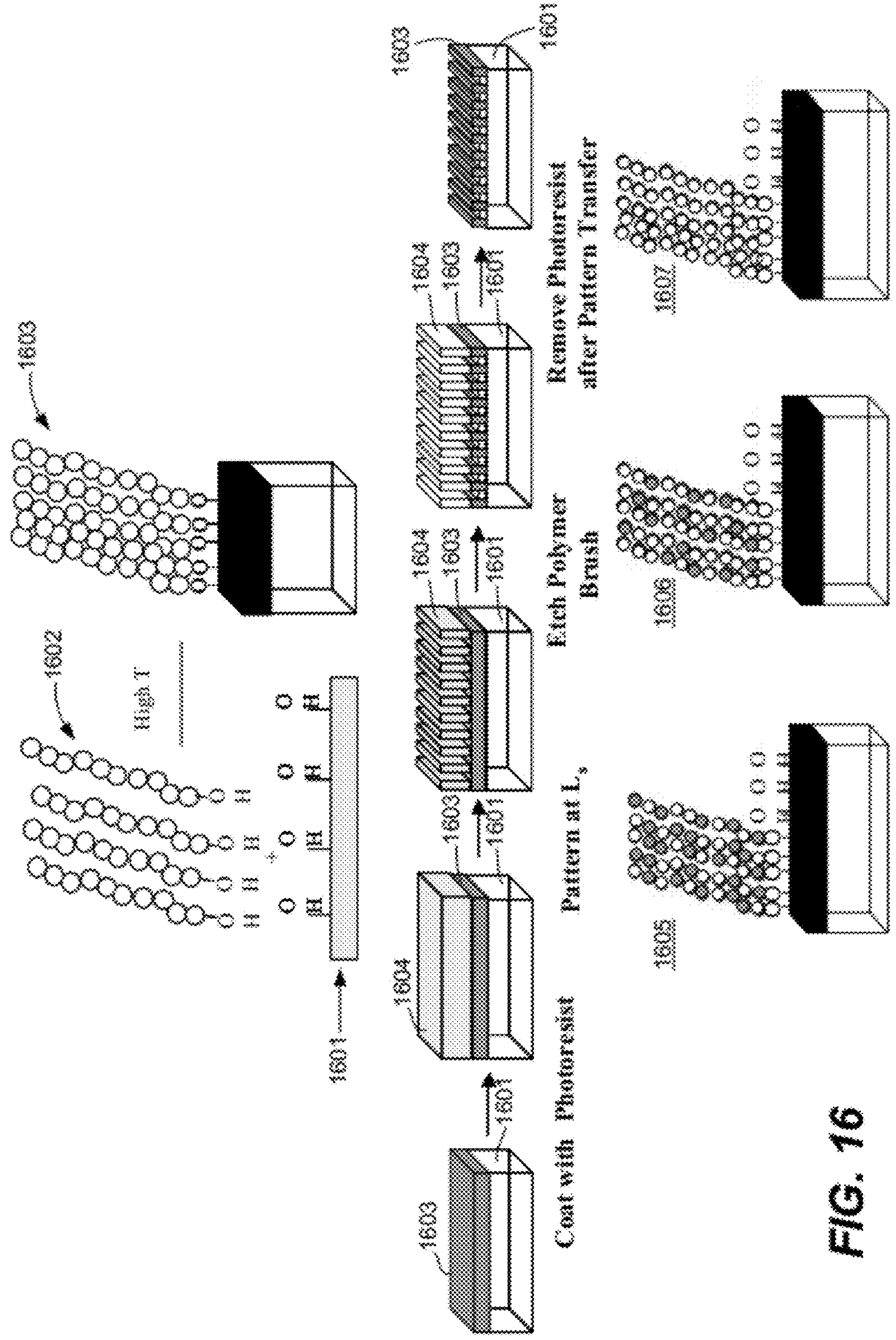
FIG. 16 shows a process of creating a patterned or activated surface using a random copolymer brush imaging layer.

FIG. 16 shows one process of creating a patterned or activated surface using a random copolymer brush imaging layer. The process involves coating the substrate 1601 with the random copolymer brush 1602 to create an imaging layer 1603. The imaging layer 1603 is then coated with photoresist 1604. Optical lithography is then used to pattern the resist 1604. The polymer brush imaging layer 1603 is then etched, transferring the pattern. The photoresist is removed after the pattern transfer. The result is a substrate patterned with regions of polymer brushes and regions of hydroxyl groups such as the patterned substrates 1605, 1606 and 1607. This technique may be used to create patterned polymer brushes of varying compositions such as those on substrates 1605, 1606 and 1607, each of which has a different chemical composition (as represented by the lighter and darker molecules in the brush).

In the example shown in FIG. 16, the pattern is a periodic pattern with a period $L_s$, however, the substrate may be patterned with any pattern including aperiodic or irregularly featured patterns.

Although the above discussion refers to creating a preferential interaction based on interfacial energy, the invention is not so limited. Preferential interactions between a region of the pattern and a component of the block copolymer may be based on any property including interfacial energy, hydrogen bonding, or any other chemical, mechanical or electrical property.

Parameters

Substrate

Any type of substrate may be used. In semiconductor applications, wherein the block copolymer film is to be used as a resist mask for further processing, substrates such as silicon or gallium arsenide may be used. According to various embodiments, the substrate may be provided with an imaging layer thereon. The imaging layer may comprise any type of material that can be patterned or selectively activated. In a preferred embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane. (See also Peters, R. D., Yang, X. M., Kim, T. K., Sohn, B. H., Nealey, P. F., Using Self-Assembled Monolayers Exposed to X-rays to Control the Wetting Behavior of Thin Films of Block Copolymers, Langmuir, 2000, 16, 4625-4631; Kim, T. K., Sohn, B. H., Yang, X. M., Peters, R. D., Nealey, P. F., Chemical Modification of Self-Assembled Monolayers by Exposure to Soft X-rays in Air, Journal of Physical Chemistry B, 2000, 104, 7403-7410. Peters, R. D., Yang, X. M., Nealey, P. F, Wetting behavior of block copolymers self-assembled films of alkylchlorosilanes: Effect of grafting density, Langmuir, 2000, 16, p. 9620-9626., each of which is hereby incorporated by reference in its entirety and for all purposes.)

In preferred embodiments, the imaging layer comprises a polymer brush. In a particularly improved embodiment, the polymer brush comprises homopolymers or copolymers of the monomers that comprise the block copolymer material. For example, a polymer brush comprised of at least one of styrene and methyl methylacrylate may be used where the block copolymer material is PS-b-PMMA. In a particularly preferred embodiment, the polymer brush is PSOH.

Patterning the Substrate

The aperiodic patterns substrates may be patterned by any method that can produce an aperiodic or irregularly featured pattern. Patterning includes all chemical, topographical, optical, electrical, mechanical patterning and all other methods of selectively activating the substrate. Of course, these methods are also appropriate to produce periodic patterns.

In embodiments where the substrate is provided with an imaging layer, patterning the substrate may comprise patterning the imaging layer. One method of patterning a polymer brush imaging layer is discussed above with respect to FIG. 16.

Alternatively, a substrate may be patterned by selectively applying the pattern material to the substrate.

Figure 17A:
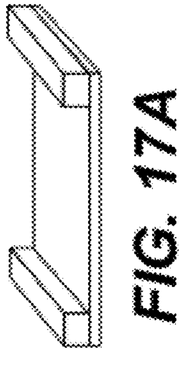
FIGS. 17A-D show a process for creating sub-lithographic resolution patterns.
Figure 17B:
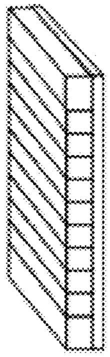
Figure 17C:
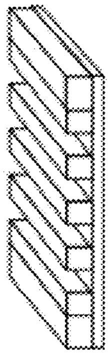
Figure 17D:
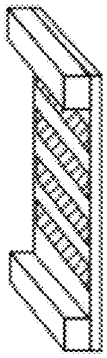

The substrate patterning may comprise top-down patterning (e.g. lithography), bottom-up assembly (e.g. block copolymer self-assembly), or a combination of top-down and bottom-up techniques. For example, FIGS. 17A-D show a process for directed self-assembly may be used in conjunction with lithography to create sub-lithographic resolution patterns. In this technique, lithography is used to activate desired regions on the substrate thereby defining gross features in FIG. 17A. A block copolymer material is then deposited on the activated regions and phase segregation is induced to direct self-assembly of the copolymer into domains (FIG. 17B). One block of the copolymer may then be selectively removed (FIG. 17C). The exposed regions of the substrate would then be selectively activated, thereby creating the pattern on the substrate (FIG. 17D). FIGS. 17A-D show a striped pattern to drive self-assembly of a lamellar domains; however this method is not limited to any particular pattern.

In a preferred embodiment, the substrate is patterned with x-ray lithography, extreme ultraviolet (EUV) lithography or electron beam lithography.

Pattern

As discussed above, in some embodiments, the patterns used in accordance with the invention are aperiodic and/or contain irregular features. Aperiodic patterns may be thought of as patterns that do not have an underlying periodicity such as found in interference patterns. Irregular features include shapes or configurations found in undirected self-assembled copolymer film. Examples of irregular features include angles, corners, t-junctions and rings. In embodiments wherein the block copolymer material exhibits lamellar morphology, irregular features include all non-linear features, including corners, angles, t-junctions and rings. In embodiments wherein the block copolymer material exhibits parallel cylindrical array morphology, irregular features also include all non-linear features. Feature dimensions typically range from 5 to 100. The patterned area of a substrate may be arbitrarily large.

Block Copolymer Material

The block copolymer material comprises a block copolymer. The block copolymer may be comprised of any number of distinct block polymers (i.e. diblock copolymers, triblock copolymers, etc.). In a preferred embodiment, the block copolymer is a diblock copolymer. A specific example is the diblock coplyomer PS-b-PMMA.

The block copolymer material may further comprise one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol).

The block copolymer material may also further comprise one or more homopolymers. In some embodiments, the material may be a block copolymer/homopolymer blend. In a preferred embodiment, the block copolymer material is a block copolymer/homopolymer/homopolymer blend. In a particularly preferred embodiment, the material is a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

EXAMPLES

The following examples provide details illustrating aspects of the present invention. These examples are provided to exemplify and more clearly illustrate these aspects of the invention and are in no way intended to be limiting.

Figure 18:
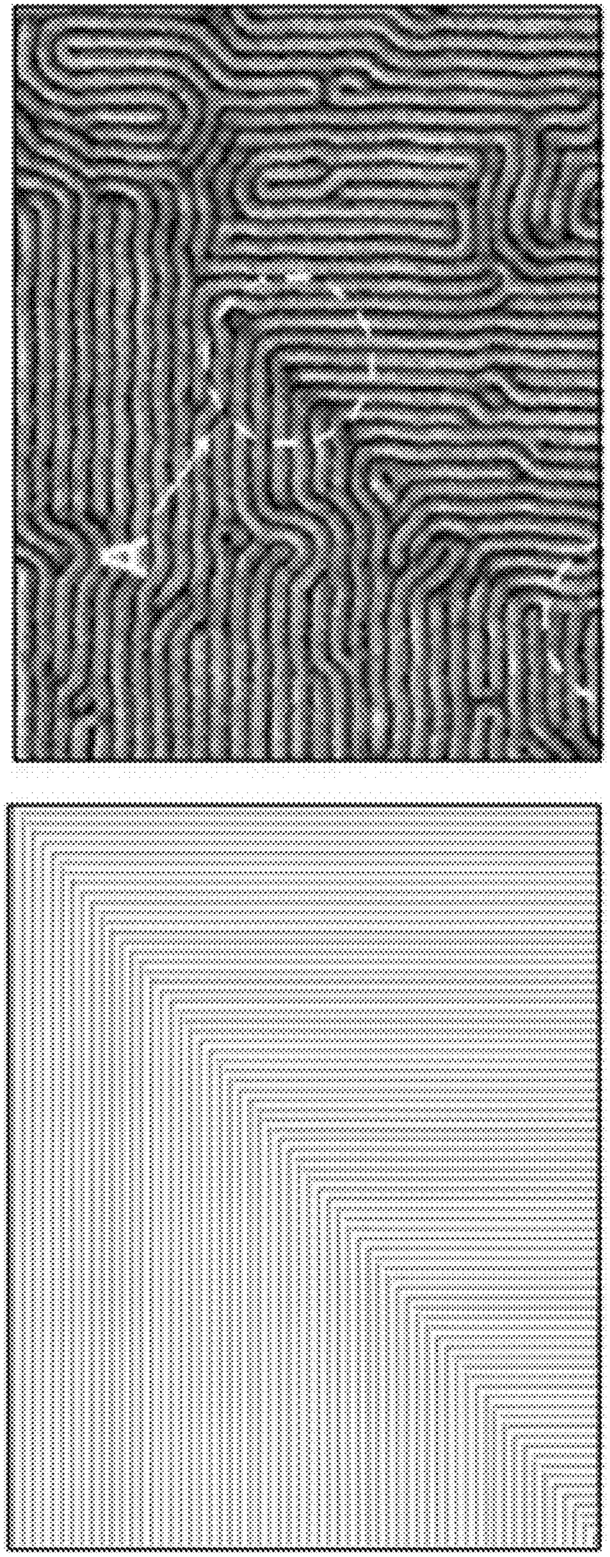
FIG. 18 is an image of a replicated pattern containing a 90° bend.
Figure 19A:
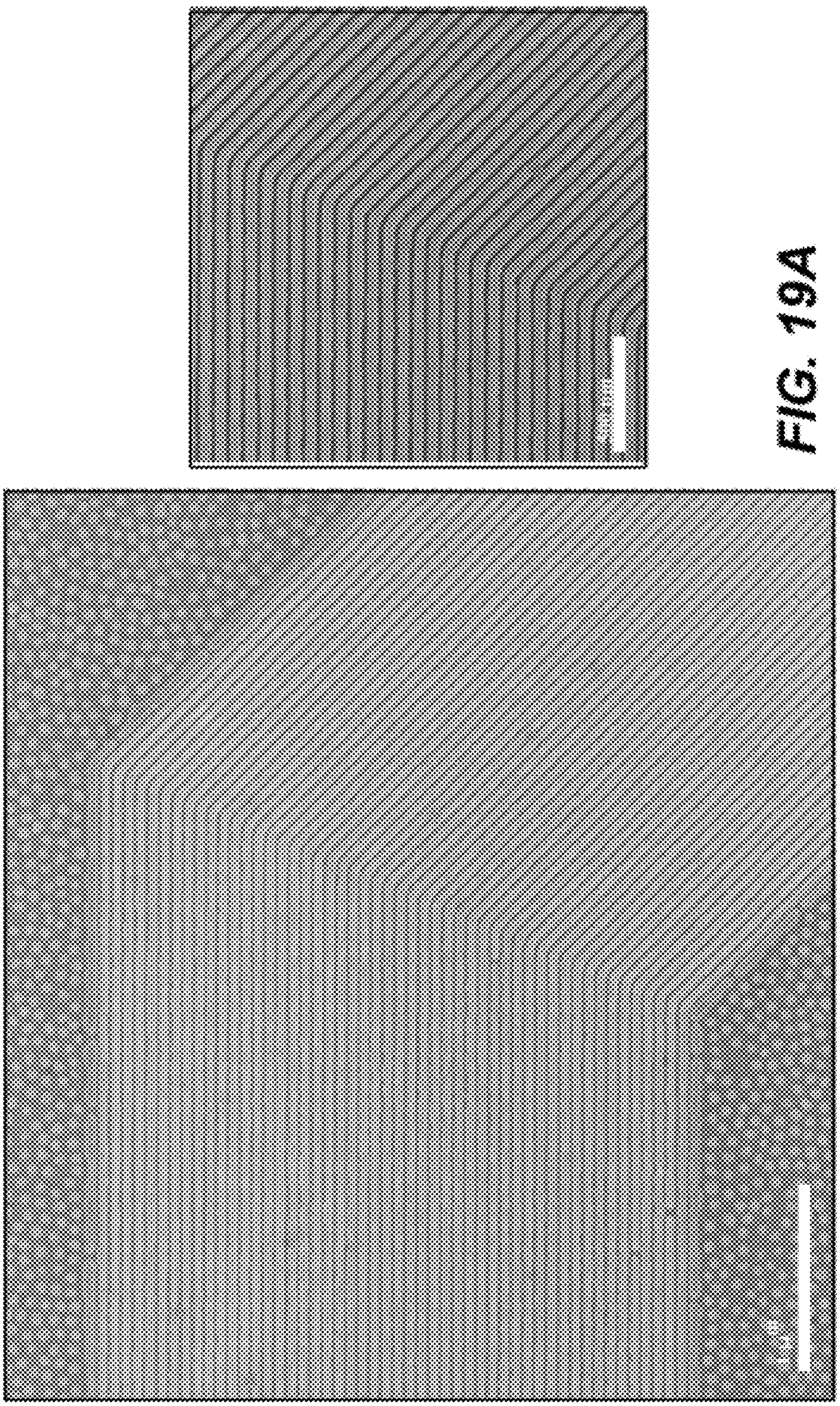
FIGS. 19A-D are images of replicated patterns containing 135° bends.
Figure 19B:
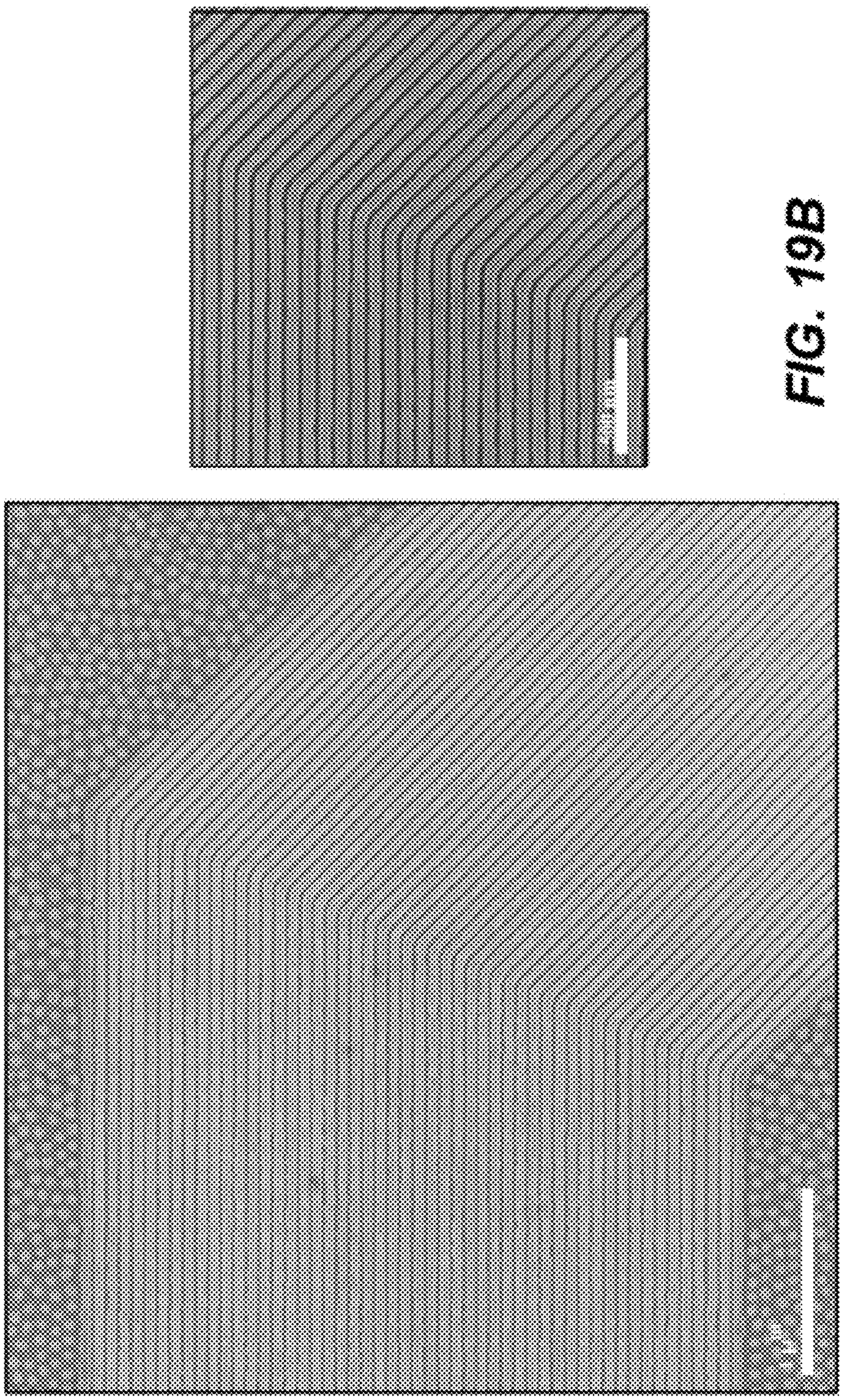
Figure 19C:
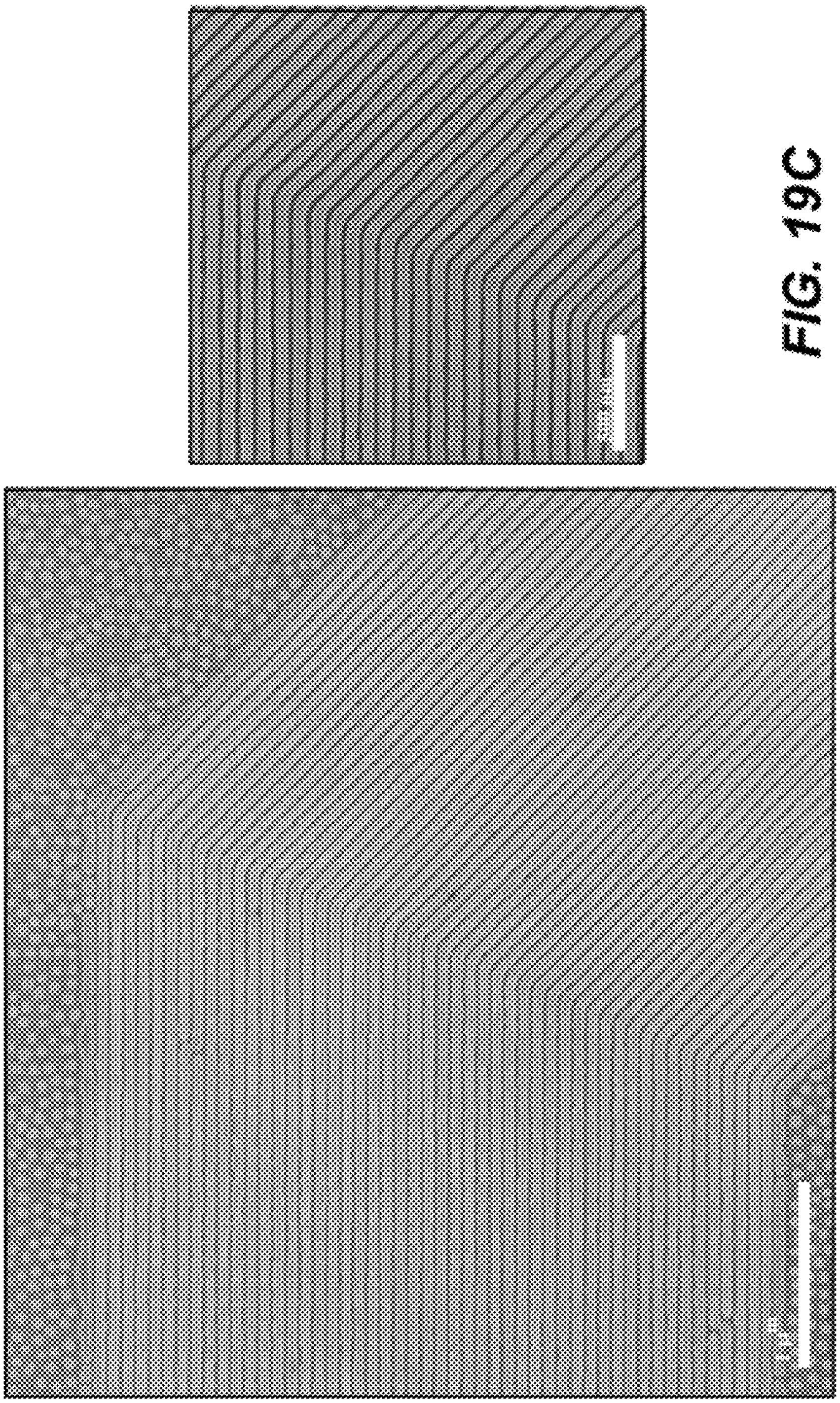
Figure 19D:
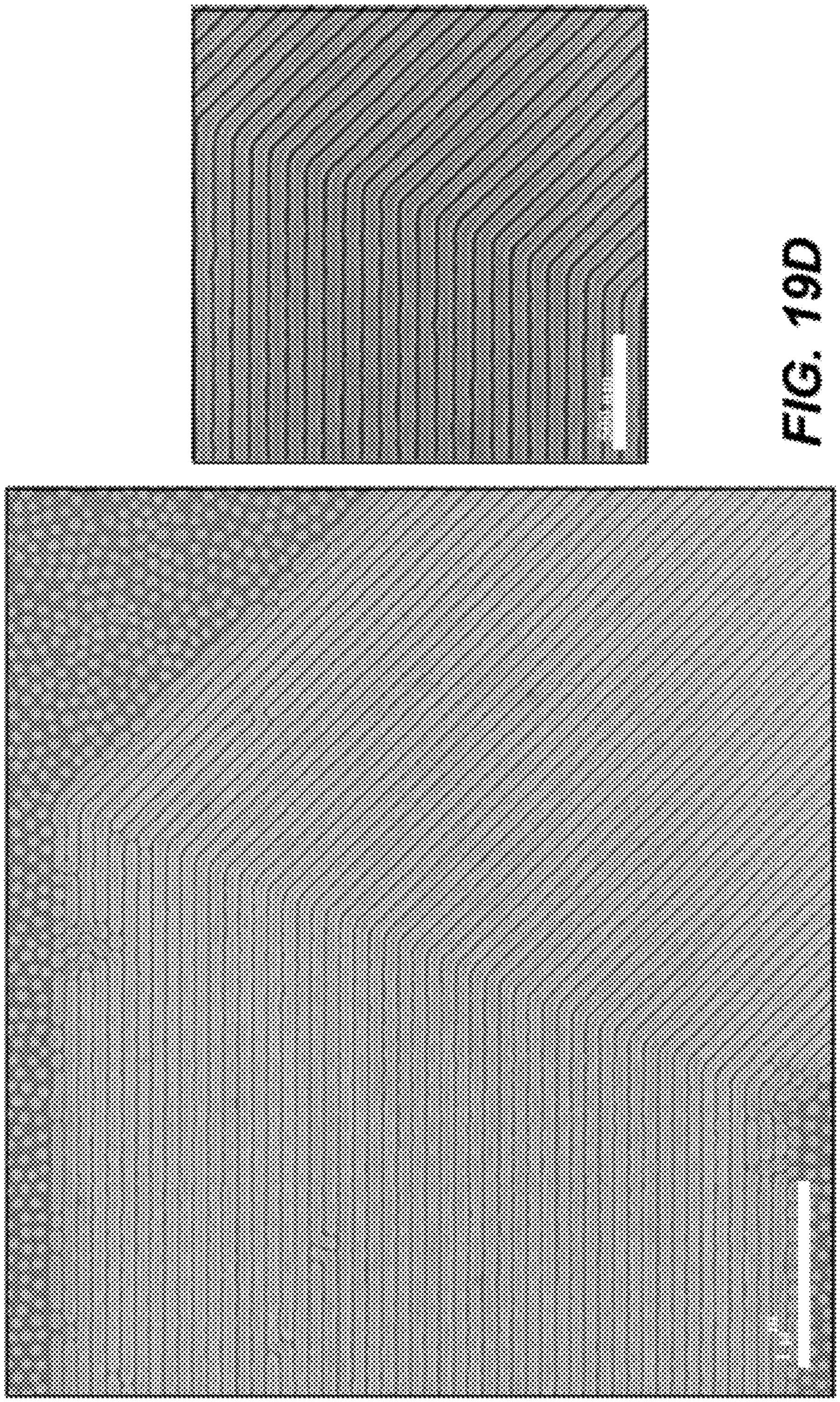
Figure 20A:
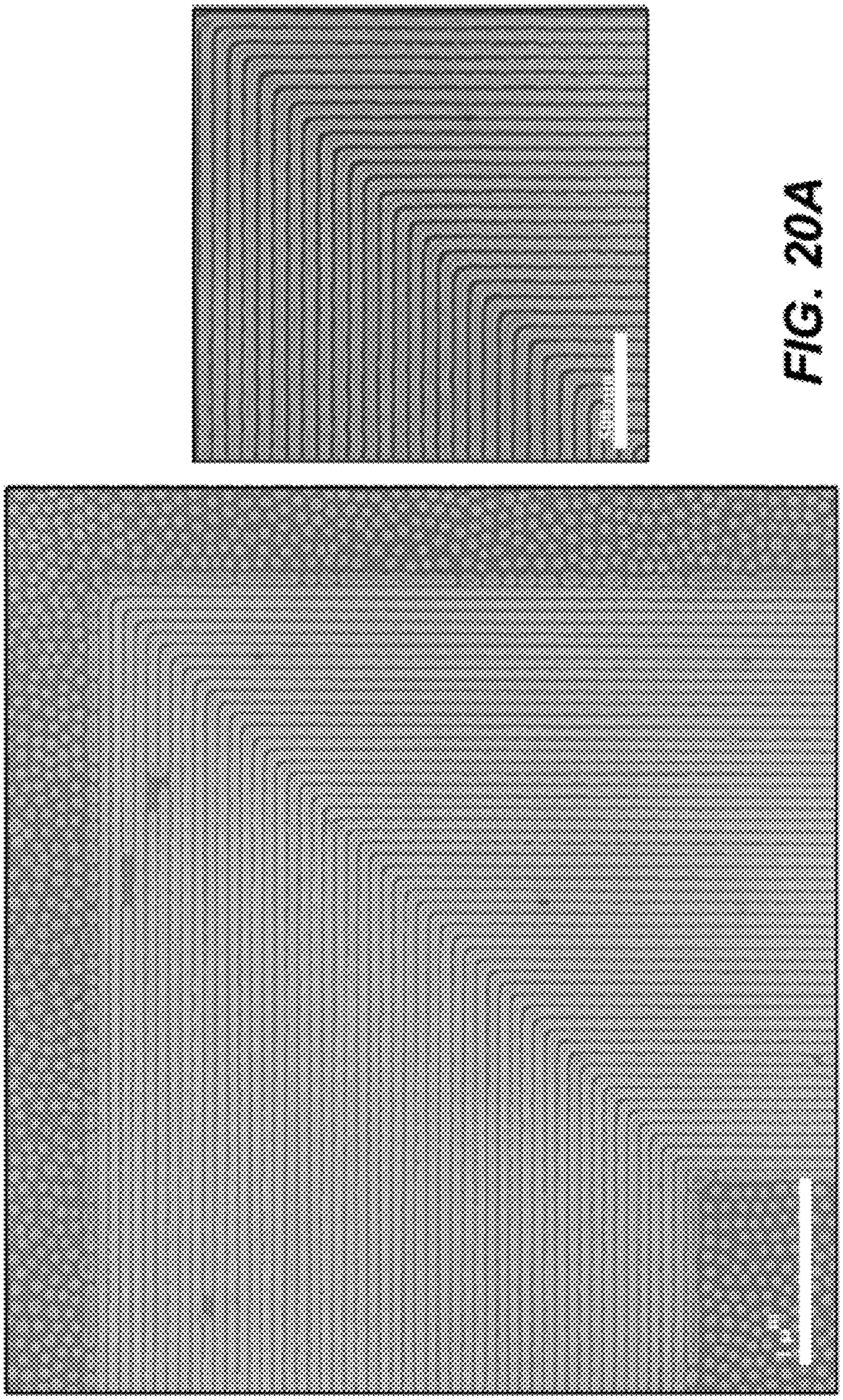
FIGS. 20A-D are images of replicated patterns containing 90° bends.
Figure 20B:
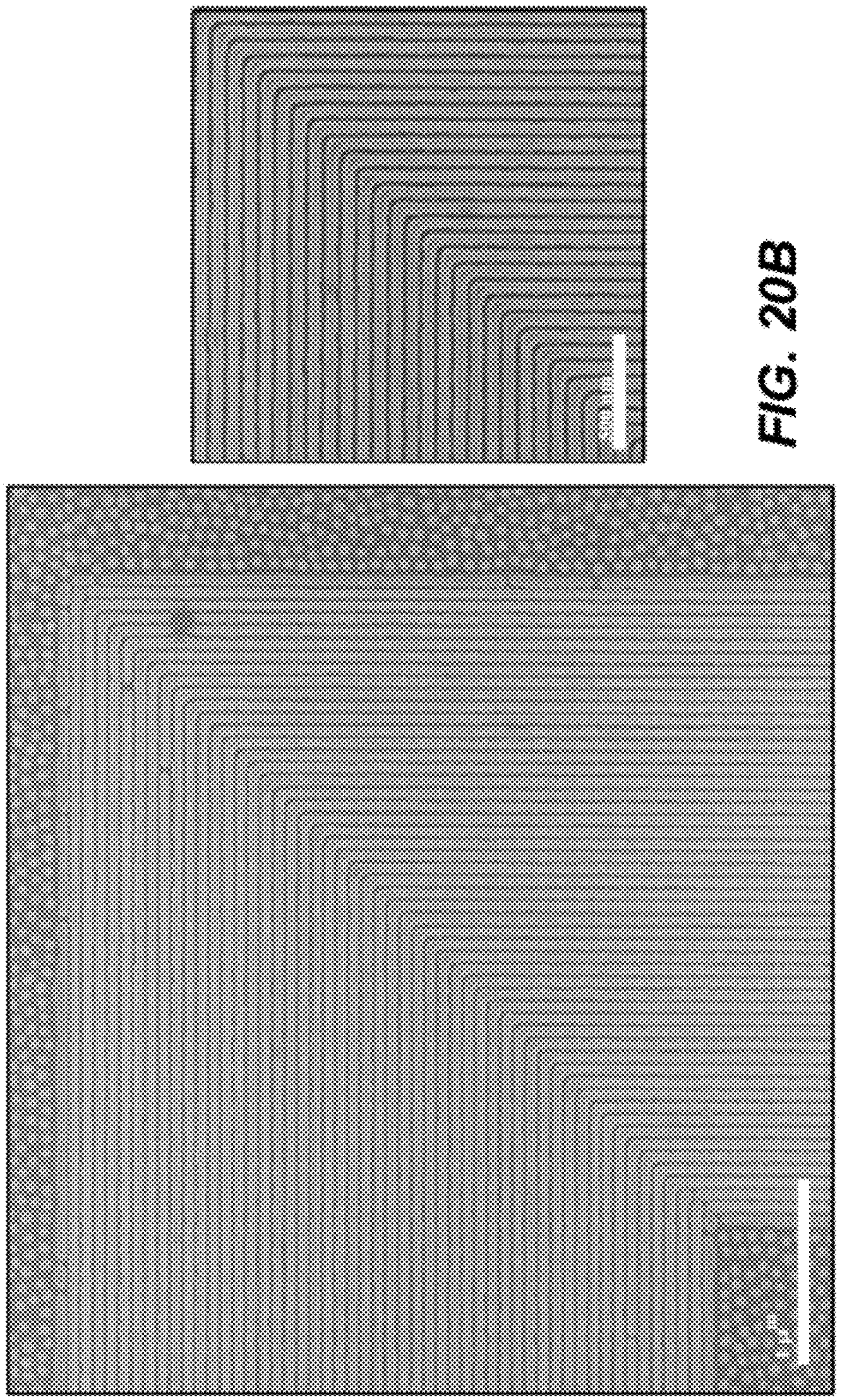
Figure 20C:
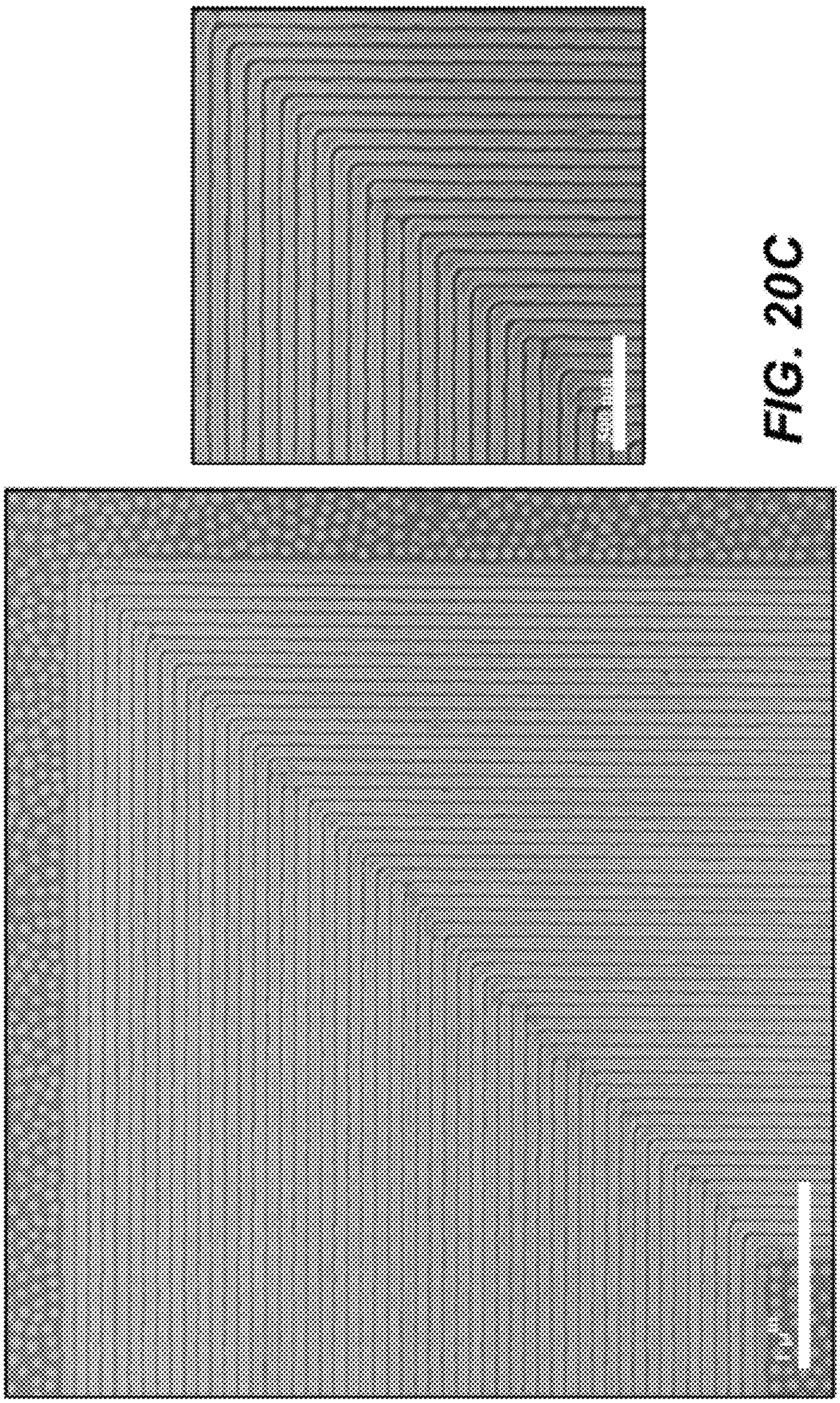
Figure 20D:
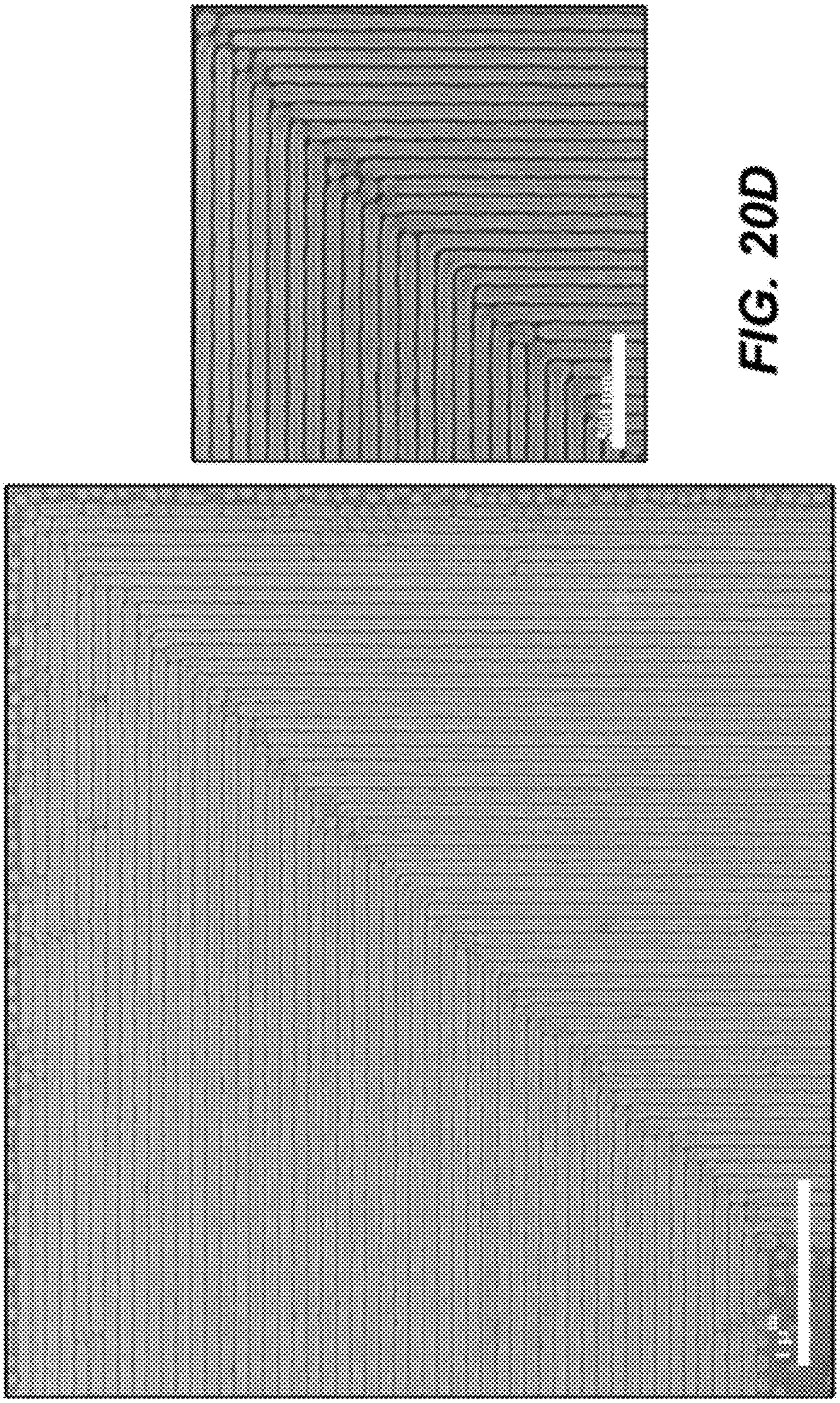

A self-assembled monolayer imaging layer was patterned with electron beam lithography. The pattern period was 49 nm and the pattern contained a 90° bend. The pattern period refers to the distance between alternate interfaces on the linear portions of the pattern. Block copolymer film of thickness 60 nm was deposited on the substrate and annealed. FIG. 18 shows an image of results. The 90° bend (the area labeled "A") was duplicated in the copolymer film. Defects observed in the assembly are likely due to defects in the underlying chemical pattern.

Block copolymer film was deposited and annealed on aperiodic patterned substrates containing bends of 45°, 90° and 135° and pattern periods of 65 nm, 70 nm, 75 nm and 80 nm. Surfaces were patterned in ~50 nm film of PMMA on a PSOH brush using the Nabity Nanowriter and a LEO VP-1550 FE-SEM. Standard lithographic processing was used to develop the photoresist. The polymer brush was then etched with a 10 s $O_2$ plasma. A PS-b-PMMA/PS/PMMA was deposited on the patterned surface and annealed for 7 days at 193° C. The block copolymer was a 100 k PS-b-PMMA, 40 k PS, and 40 k PMMA blend with a $\phi_H$ (homopolymer volume fraction) of 0.4. The period of the blend, $L_B$, was 70 nm.

FIGS. 19A-D are images of the self-assembled block copolymer film on patterns having a 135° bend and a $L_s$ of 65 nm, 70 nm, 75 nm and 80 nm. The films are well-ordered for all pattern periods, with some defects observed especially on the $L_s$=80 nm pattern. At least some defects are a result of defects in the underlying pattern and not necessarily due to imperfect duplication and registration. All of the films are virtually defect-free at the 135° bend.

FIGS. 20A-D are images of the self-assembled block copolymer film on patterns having a 90° bend and a $L_s$ of 65 nm, 70 nm, 75 nm and 80 nm. The films are well-ordered at the bends for pattern periods of 65 nm and 70 nm. Defects are observed in the bends at a pattern period of 75 nm and 80 nm. Dark areas are observed on the lighter stripes at the bends. These are believed to indicate the presence of homopolymer that has diffused from the (lower period) linear regions of the pattern to the (higher period) bends. As discussed above with respect to FIG. 6A, the effective $L_s$ at the bend is increased by a factor of 1/sin(θ/2). For a 90° bend, the effective period is over 40% greater at the bend than at a linear region.

FIGS. 21A-D are images of the self-assembled block copolymer film on patterns having a 45° bend and a $L_s$ of 65 nm, 70 nm, 75 nm and 80 nm. The effective period at the bends is over 160% greater than at the linear regions. The film is well-ordered with no defects at the bends for $L_s$=65 nm. This is because the 70 nm $L_B$ has enough homopolymer to diffuse from the 65 nm linear regions to the bends, it is believed. Some defects are observed at the bends for the 70 nm pattern, while almost all the lamellae contain defects at the bends in the 75 nm and 80 nm patterns. This is because there is not enough homopolymer available to diffuse from the linear regions to the bends, it is believed.

CdSe nanoparticles were dispersed in a PS-b-PMMA/PS/PMMA blend. The composition of the ternary blend was 80% PS-b-PMMA, 10% PS and 10% PMMA. The nanoparticles comprised 5% of the material. The material was then deposited on a patterned substrate having a 55 nm period and a 90° bend and ordered. The nanoparticles, the surfaces of which are capped by hydrophobic molecules (tetradecyl phosphonic acid) selectively segregate to the PS domain of the self-assembled lamellae.

Figure 22B:
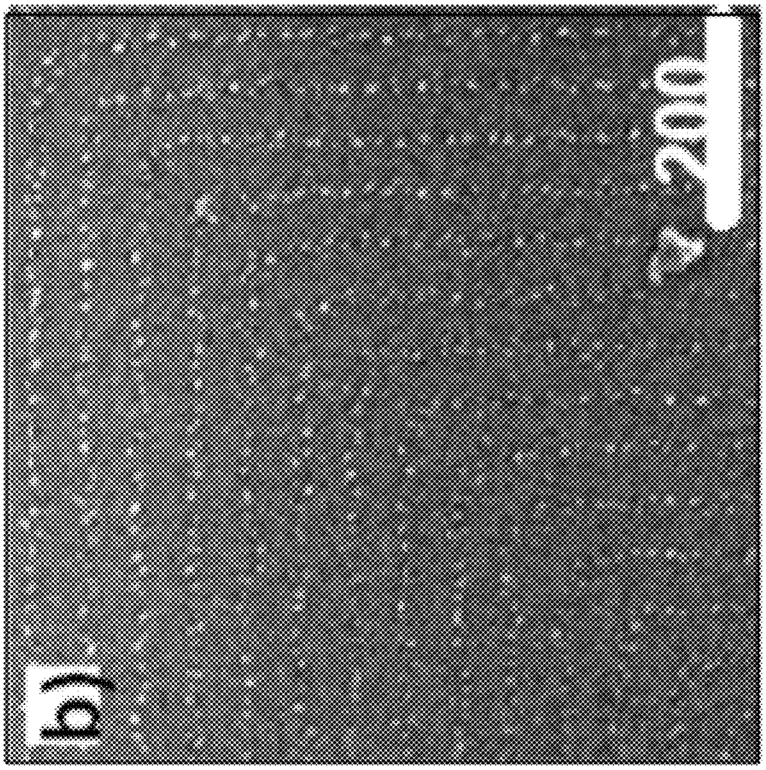
FIGS. 22A and 22B show SEM images of a block copolymer material containing nanoparticles as ordered on a pattern containing a 90° bend.
Figure 22A:
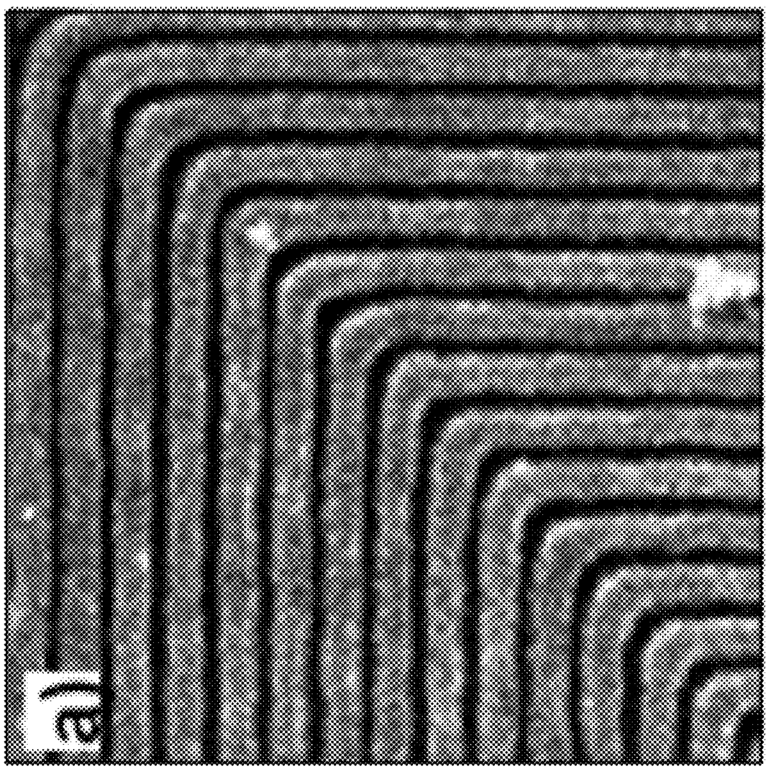

FIG. 22A shows a top-down SEM image of the ternary blend. FIG. 22B shows a top-down SEM image of the CdSe aligned around the 90° bend, which corresponds to the same region of FIG. 22A. The block copolymer used to align the nanoparticles was completely removed by O2 plasma treatment.

CdSe nanoparticles were aligned using PS-b-PMMA and ternary PS-b-PMMA/PS/PMMA blend thin films on chemically patterned substrate. The nanoparticles, the surfaces of which are capped by hydrophobic molecules (tetradecyl phosphonic acid), selectively segregate to the PS domain of the self-assembled lamellae. The polymer films were removed by $O_2$ plasma leaving the nanoparticles. Results are shown in FIG. 15B. The SEM image on the left shows CdSe nanoparticles aligned using PS-b-PMMA blend on a substrate having a period of 55 nm. The middle image shows CdSe nanoparticles aligned using a 80% PS-b-PMMA, 10% PS and 10% PMMA blend on a substrate having a period of 60 nm. The right image shows CdSe nanoparticles aligned using a 60% PS-b-PMMA, 20% PS and 20% PMMA blend on a substrate having a period of 75 nm. The insets are the top-down SEM images of the directed assembly of polymer films with nanoparticles before $O_2$ plasma treatment. The images show that the nanoparticles are aligned in accordance with the pattern period.

CdSe nanoparticles were aligned using a PS-b-PMMA thin film on chemically patterned substrates having different periods. The lamellar periodicity of PS-b-PMMA/CdSe material was about 51 nm. The block copolymer used to align the nanoparticles was completely removed by $O_2$ plasma treatment. Results are shown in FIGS. 23A-C. The pattern periodicity of the chemically patterned substrate is 50 nm (FIG. 23A), 55 nm (FIG. 23B) and 60 nm (FIG. 23C), respectively. The insets are top-down SEM images of the directed assembly of polymer films with nanoparticles before $O_2$ plasma treatment. (Since the pattern periodicity of (A) is smaller than the lamellar periodicity of PS-b-PMMA/CdSe (~51 nm), the nanoparticle arrays on (A) are slightly mismatched with PS domains. (B) and (C) are progressively more mismatched)

Discussion and further examples of replication of irregular patterns may be found in Stoykovich, M. P., Müller, M., Kim, S. O., Solak, H. H., Edwards, E. W., de Pablo, J. J., Nealey, P. F., Directed Assembly of Block Copolymer Blends into Non-regular Device Oriented Structures, *Science* (accepted for publication, 2005), which is hereby incorporated by reference in its entirety and for all purposes.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:

1. A method of forming copolymer structures, comprising:

(a) providing a patterned substrate, the pattern having at least one irregular feature;

(b) depositing a layer of copolymer material comprising a block copolymer on at least a patterned portion of the substrate, said patterned portion including the at least one irregular feature; and (c) ordering components in the copolymer material in accordance with the underlying pattern to replicate the underlying pattern, including replicating the at least one irregular feature, in the layer.

2. The method of claim 1 wherein the block copolymer is a copolymer of polystyrene (PS) and poly(methylmeacrylate) (PMMA).

3. The method of claim 1 wherein the copolymer material further comprises at least one of a second copolymer, a first homopolymer and a second homopolymer, the second copolymer being compositionally different from the block copolymer and the first homopolymer being compositionally different than the second homopolymer.

4. The method of claim 3 wherein the copolymer material comprises the first homopolymer and the first homopolymer is the same type of polymer as a first polymer block in the block copolymer.

5. The method of claim 4 wherein the copolymer material further comprises the second homopolymer and the second homopolymer is same type of polymer as a second polymer block in the block copolymer.

6. The method of claim 1 wherein the copolymer material is a PS-b-PMMA/PS/PMMA blend.

7. The method of claim 6 wherein the volume fraction of the PS-b-PMMA in the PS-b-PMMA/PS/PMMA blend is between 0.4 and 0.6.

8. The method of claim 1 wherein regions of the surface pattern interact in a preferential manner with at least one of the components in the copolymer material.

9. The method of claim 8 wherein the difference between the interfacial energy between a region of the pattern and a first block of the copolymer and the interfacial energy between the region and a second block of the copolymer is least 0.6 ergs/$cm^2$.

10. The method of claim 1 wherein the patterned substrate comprises a patterned imaging layer, said imaging layer comprising a polymer brush comprising at least one homopolymer or copolymer of the monomers that comprise the block copolymer material.

11. The method of claim 1 further comprising selectively removing one of the components of the copolymer material.

12. The method of claim 1 wherein the pattern includes at least one angle.

13. The method of claim 12 wherein the pattern includes at least one of a 45° angle, a 90° angle and a 135° angle.

14. The method of claim 1 wherein ordering the components of the copolymer material in accordance with the underlying pattern comprises stretching or compressing at least one of the components of the material.

15. The method of claim 1 wherein the copolymer material is non-uniformly distributed over the substrate.

16. The method of claim 1 wherein the pattern has a sublithographic resolution.

17. The method of claim 1 wherein the pattern comprises an aperiodic region and a periodic region.

18. The method of claim 1 wherein the copolymer material is a blended copolymer material; the blended copolymer material comprising a first block copolymer and at least one of a second copolymer, a first homopolymer and a second homopolymer, wherein said first block copolymer and said second copolymer are compositionally different and said first homopolymer and said second homopolymer are compositionally different.

19. The method of claim 18, wherein the period of the blended copolymer material is approximately equal to at least one period of a region of the pattern.

20. The method of claim 18 wherein the blended copolymer material comprises the first block copolymer and the first homopolymer.

21. The method of claim 1 further comprising patterning the substrate by x-ray lithography, extreme ultraviolet (EUV) lithography or electron beam lithography.

22. The method of claim 1 wherein ordering components of the copolymer material comprises annealing the copolymer material above the glass transition temperature of the blocks of the copolymer material.

23. The method of claim 1 wherein the copolymer material includes a solvent, plasticizer, or supercritical fluid.

24. The method of claim 1 wherein the pattern includes at least one t-junction.

25. The method of claim 1 wherein the pattern includes at least one ring.

26. The method of claim 1 wherein the pattern includes at least one corner.

* * * * *